United States Patent
Nakayama et al.

(10) Patent No.: US 9,859,512 B2
(45) Date of Patent: Jan. 2, 2018

(54) SUBSTRATE HAVING RUGGED STRUCTURE OBTAINED FROM HYDROPHOBIC SOL/GEL MATERIAL

(71) Applicant: JX NIPPON OIL & ENERGY CORPORATION, Tokyo (JP)

(72) Inventors: Keisuke Nakayama, Yokohama (JP); Madoka Takahashi, Tokyo (JP); Takashi Seki, Yokohama (JP)

(73) Assignee: JXTG NIPPON OIL & ENERGY CORPORATION, Tokyo (JP)

( * ) Notice: Subject to any disclaimer, the term of this patent is extended or adjusted under 35 U.S.C. 154(b) by 0 days.

(21) Appl. No.: 14/876,539

(22) Filed: Oct. 6, 2015

(65) Prior Publication Data

US 2016/0028031 A1 Jan. 28, 2016

Related U.S. Application Data

(63) Continuation of application No. PCT/JP2014/060275, filed on Apr. 9, 2014.

(30) Foreign Application Priority Data

Apr. 26, 2013 (JP) ................................. 2013-094025

(51) Int. Cl.
*H01L 51/00* (2006.01)
*C09D 183/04* (2006.01)
(Continued)

(52) U.S. Cl.
CPC ........ *H01L 51/0096* (2013.01); *C09D 183/04* (2013.01); *C09D 183/16* (2013.01);
(Continued)

(58) Field of Classification Search
CPC ..... C09D 183/04; C09D 183/16; H01L 51/00; H01L 51/52; H01L 51/56; H01L 51/0096;
(Continued)

(56) References Cited

U.S. PATENT DOCUMENTS

2002/0006558 A1 1/2002 Kobayashi et al.
2002/0160153 A1 10/2002 Minami et al.
(Continued)

FOREIGN PATENT DOCUMENTS

CA 2830078 A1 10/2012
CN 1201916 C 5/2005
(Continued)

OTHER PUBLICATIONS

Jul. 15, 2016 Office Action issued in Chinese Patent Application No. 201480023757.0.
(Continued)

*Primary Examiner* — Thanh T Nguyen
(74) *Attorney, Agent, or Firm* — Oliff PLC

(57) ABSTRACT

There are provided a fine concave-convex structure substrate which is hydrophobic and excellent in heat resistance, a solution used for producing the concave-convex structure substrate, and a method for producing the concave-convex structure substrate. The concave-convex structure substrate having the concave-convex structure includes a concave-convex structure layer made of a sol-gel material, and a contact angle of water on the sol-gel material in a flat and smooth film shape is not less than 80°. The concave-convex structure substrate according to the present invention has a hydrophobic surface, and thus, in the element in which the concave-convex structure substrate is incorporated, moisture adsorption onto the surface of the concave-convex structure substrate can be prevented, thereby making it possible to lengthen a service life of the element.

5 Claims, 10 Drawing Sheets

(51) Int. Cl.
  *H01L 51/52* (2006.01)
  *H01L 51/56* (2006.01)
  *C09D 183/16* (2006.01)
  *C08G 77/62* (2006.01)
  *C08G 77/04* (2006.01)

(52) U.S. Cl.
  CPC .......... *H01L 51/5262* (2013.01); *H01L 51/56* (2013.01); *C08G 77/04* (2013.01); *C08G 77/62* (2013.01); *Y02E 10/549* (2013.01); *Y02P 70/521* (2015.11)

(58) Field of Classification Search
  CPC ..... H01L 51/5262; C08G 77/04; C08G 77/62; Y02E 10/549; Y02P 70/521
  See application file for complete search history.

(56) References Cited

U.S. PATENT DOCUMENTS

| | | | |
|---|---|---|---|
| 2003/0025225 A1* | 2/2003 | Shimmo | B29C 33/56 264/1.31 |
| 2003/0047822 A1 | 3/2003 | Hori et al. | |
| 2006/0251837 A1* | 11/2006 | Cnossen | C09D 1/00 428/35.7 |
| 2008/0011934 A1 | 1/2008 | Verschuuren et al. | |
| 2012/0132897 A1 | 5/2012 | Seki et al. | |
| 2013/0299796 A1 | 11/2013 | Masuyama et al. | |
| 2013/0319522 A1 | 12/2013 | Koike et al. | |
| 2014/0030833 A1* | 1/2014 | Sato | H01L 51/0096 438/34 |
| 2016/0161647 A1 | 6/2016 | Masuyama et al. | |

FOREIGN PATENT DOCUMENTS

| | | |
|---|---|---|
| CN | 100349999 C | 11/2007 |
| CN | 101817980 A | 9/2010 |
| EP | 1048427 A2 | 11/2000 |
| EP | 1 174 258 A1 | 1/2002 |
| EP | 2693241 A1 | 2/2014 |
| JP | H05-238827 A | 9/1993 |
| JP | H06-122852 A | 5/1994 |
| JP | H06-240208 A | 8/1994 |
| JP | H06-299118 A | 10/1994 |
| JP | H06-306329 A | 11/1994 |
| JP | H07-196986 A | 8/1995 |
| JP | H11-344804 A | 12/1999 |
| JP | 2001-240800 A | 9/2001 |
| JP | 2008-049544 A | 3/2008 |
| JP | 2008-116747 A | 5/2008 |
| JP | 2008-209433 A | 9/2008 |
| JP | 2010-269480 A | 12/2010 |
| JP | 2012-182102 A | 9/2012 |
| TW | 201240791 A | 10/2012 |
| TW | 201304229 A | 1/2013 |
| WO | 2011/007878 A1 | 1/2011 |
| WO | 2012/077738 A1 | 6/2012 |
| WO | 2012/096368 A1 | 7/2012 |
| WO | 2012/133414 A1 | 10/2012 |

OTHER PUBLICATIONS

Apr. 7, 2016 Office Action issued in Australian Patent Application No. 2014258629.
Oct. 27, 2015 International Preliminary Report on Patentability issued in International Patent Application No. PCT/JP2014/060275.
Jul. 22, 2014 International Search Report issued in International Patent Application No. PCT/JP2014/060275.
Sep. 30, 2016 Extended European Search Report issued in European Patent Application No. 14787727.8.
Nov. 25, 2016 Office Action issued in Canadian Patent Application No. 2,910,125.
Mar. 17, 2017 Office Action issued in Taiwanese Patent Application No. 103113807.
Feb. 27, 2017 Office Action issued in Chinese Application No. 201480023757.0.
Dec. 14, 2016 Notice to Submit a Response issued in Korean Patent Application No. 10-2015-7024728.
Jun. 23, 2017 Office Action issued in Korean Patent Application No. 10-2015-7024728.
May 30, 2017 Office Action issued in Japanese Patent Application No. 2015-513671.

* cited by examiner

Fig. 8A

| No. | AMOUNT OF MIXED SILICA SOURCES (mol) | | | | |
|---|---|---|---|---|---|
| | TEOS | MTES | DMDES | PTES | FTES |
| EXAMPLE 1 | 0.2 | 0.8 | 0 | 0 | 0 |
| EXAMPLE 2 | 0 | 1 | 0 | 0 | 0 |
| EXAMPLE 3 | 0.85 | 0 | 0.15 | 0 | 0 |
| EXAMPLE 4 | 0.8 | 0 | 0.2 | 0 | 0 |
| EXAMPLE 5 | 0.75 | 0 | 0.25 | 0 | 0 |
| EXAMPLE 6 | 0.65 | 0 | 0.35 | 0 | 0 |
| EXAMPLE 7 | 0.2 | 0 | 0 | 0.8 | 0 |
| EXAMPLE 8 | 1 | 0 | 0 | 0 | 0.005 |
| EXAMPLE 9 | 0.5 | 0.5 | 0 | 0 | 0.005 |
| EXAMPLE 10 | 0.75 | 0 | 0.25 | 0 | 0.001 |
| COMPARATIVE EXAMPLE 1 | 1 | 0 | 0 | 0 | 0 |
| COMPARATIVE EXAMPLE 2 | 0.75 | 0.25 | 0 | 0 | 0 |
| COMPARATIVE EXAMPLE 3 | 0.5 | 0.5 | 0 | 0 | 0 |
| COMPARATIVE EXAMPLE 4 | 0.4 | 0.6 | 0 | 0 | 0 |
| COMPARATIVE EXAMPLE 5 | 0.95 | 0 | 0.05 | 0 | 0 |
| COMPARATIVE EXAMPLE 6 | 0.9 | 0 | 0.1 | 0 | 0 |
| COMPARATIVE EXAMPLE 7 | 0.6 | 0 | 0.4 | 0 | 0 |
| COMPARATIVE EXAMPLE 8 | 0.5 | 0 | 0.5 | 0 | 0 |
| COMPARATIVE EXAMPLE 9 | 0.5 | 0.5 | 0 | 0 | 0.01 |
| COMPARATIVE EXAMPLE 10 | 0.75 | 0 | 0.25 | 0 | 0.01 |

Fig. 8B

| No. | CONTACT ANGLE (deg) | THE NUMBER OF DARK SPOTS (piece(s)/mm$^2$) | CONCAVE-CONVEX PATTERN TRANSFERABILITY | | | | |
|---|---|---|---|---|---|---|---|
| | | | 20 s | 90 s | 300 s | 1200 s | |
| EXAMPLE 1 | 85 | <1 | + | + | + | + | |
| EXAMPLE 2 | 93 | <1 | + | + | + | + | |
| EXAMPLE 3 | 86 | <1 | ++ | ++ | ++ | ++ | |
| EXAMPLE 4 | 85 | <1 | ++ | ++ | ++ | ++ | |
| EXAMPLE 5 | 84 | <1 | ++ | ++ | ++ | ++ | |
| EXAMPLE 6 | 90 | <1 | + | + | + | + | |
| EXAMPLE 7 | 82 | <1 | ++ | - | - | - | |
| EXAMPLE 8 | 100 | <1 | ++ | ++ | ++ | ++ | |
| EXAMPLE 9 | 100 | <1 | ++ | - | - | - | |
| EXAMPLE 10 | 98 | <1 | ++ | ++ | ++ | ++ | |
| COMPARATIVE EXAMPLE 1 | 28 | 5 | ++ | ++ | ++ | ++ | |
| COMPARATIVE EXAMPLE 2 | 59 | 41 | ++ | - | - | - | |
| COMPARATIVE EXAMPLE 3 | 73 | 32 | ++ | ++ | ++ | ++ | |
| COMPARATIVE EXAMPLE 4 | 77 | 13 | ++ | ++ | ++ | ++ | |
| COMPARATIVE EXAMPLE 5 | 65 | 24 | ++ | ++ | - | - | |
| COMPARATIVE EXAMPLE 6 | 77 | 16 | ++ | ++ | - | - | |
| COMPARATIVE EXAMPLE 7 | NO FILM WAS FORMED | | | | | | |
| COMPARATIVE EXAMPLE 8 | NO FILM WAS FORMED | | | | | | |
| COMPARATIVE EXAMPLE 9 | NO FILM WAS FORMED | | | | | | |
| COMPARATIVE EXAMPLE 10 | NO FILM WAS FORMED | | | | | | |

SUBSTRATE HAVING RUGGED STRUCTURE OBTAINED FROM HYDROPHOBIC SOL/GEL MATERIAL

CROSS REFERENCE TO RELATED APPLICATION

This application is a continuation application of International Patent Application No. PCT/JP2014/060275 filed on Apr. 9, 2014 claiming the benefit of priority of Japanese Patent Application No. 2013-094025 filed on Apr. 26, 2013. The contents of International Patent Application No. PCT/JP2014/060275 and Japanese Patent Application No. 2013-094025 are incorporated herein by reference in their entities.

BACKGROUND OF THE INVENTION

Field of the Invention

The present invention relates to a substrate having a concave-convex structure (rugged structure, concave and convex structure) obtained by using a hydrophobic sol-gel material (sol/gel material), a solution used for producing the substrate having the concave-convex structure, and a method for producing the substrate having the concave-convex structure.

Description of the Related Art

The lithography method is known as a method for forming a fine pattern (minute pattern) such as a semiconductor integrated circuit. The resolution of a pattern formed by the lithography method depends on the wavelength of a light source, the numerical aperture of an optical system, etc., and a shorter wavelength light source is desired so as to respond to the demand for miniaturized devices in the recent years. Any short wavelength light source is, however, expensive and is not easily developed, and any optical material allowing such short wavelength light to pass therethrough needs to be developed, as well. Further, a large sized optical element is required for producing a pattern with a large area by means of the conventional lithography method, which is difficult both technically and economically. Therefore, a new method for forming a desired pattern having a large area has been considered.

The nano-imprint method is known as a method for forming a fine pattern without using any conventional lithography apparatus. The nano-imprint method is a technology capable of transferring a pattern in nano-meter order by sandwiching a resin between a mold (die) and a substrate, and is expected to be practiced not only in the field of semiconductor device but also in many fields such as optical members like organic EL element, LED, etc.; MEMS; biochips; and the like.

As the nanoimprint method using a thermosetting material, there has been known a method such as that described in Japanese Patent Application Laid-open No. 2008-049544. That is, a substrate is coated with a resist film, the substrate is pressed with a mold having a flat plate shape, and then the resist film is cured using a heater. A nanoimprint molded product using an inorganic sol-gel material, in particular, has high heat resistance, and thus it is suitable for the process including a high temperature treatment. In addition to the pressing method using the flat-plate shaped mold, there has been known the roll press method, as described in Japanese Patent Application Laid-open No. 2010-269480, in which a pressing roll and a cylindrical master plate for duplication having a minute concave-convex pattern are used.

Meanwhile, moisture or water may reduce the luminance, light emission efficiency, and the like, of the organic EL element. Thus, there has been studied the technology for keeping the humidity of inside of the device low, such as the organic EL element including a moisture scavenger, as described in Japanese Patent Application Laid-open No. 2012-182102.

SUMMARY OF THE INVENTION

In view of the problems described above, it is desired to provide the technology for producing the substrate usable for the organic EL element and the like, which allows to produce the substrate with an excellent transferability and to easily produce a substrate which has excellent heat resistance, and water resistance.

An object of the present invention is to provide a fine or minute concave-convex structure substrate (a substrate having a fine or minute concave-convex structure) which is hydrophobic and excellent in heat resistance, a solution used for the production of the concave-convex structure substrate, and a method for producing the concave-convex structure substrate.

According to a first aspect of the present invention, there is provided a concave-convex structure substrate, including:
  a substrate; and
  a concave-convex structure layer made of a sol-gel material and formed on the substrate,
  wherein a contact angle of water on the sol-gel material in a flat and smooth film shape is not less than 80°.

In the concave-convex structure substrate, the sol-gel material may contain at least one of tetraalkoxysilane, trialkoxysilane, and dialkoxysilane.

In the concave-convex structure substrate, the sol-gel material may contain the tetraalkoxysilane and the dialkoxysilane.

In the concave-convex structure substrate, the sol-gel material may contain the dialkoxysilane, and the dialkoxysilane may have a methyl group. The dialkoxysilane may be dimethyldiethoxysilane. Further, the sol-gel material may contain 15 to 35 mol % of the dialkoxysilane.

In the concave-convex structure substrate, the sol-gel material may contain the tetraalkoxysilane, and the tetraalkoxysilane may be tetraethoxysilane.

In the concave-convex structure substrate, the sol-gel material may contain the trialkoxysilane, and the trialkoxysilane may be methyltriethoxysilane or phenyltriethoxysilane.

In the concave-convex structure substrate, the sol-gel material may further contain fluorine-containing alkoxysilane. Further, the sol-gel material may contain less than 1 mol % of the fluorine-containing alkoxysilane.

In the concave-convex structure substrate, the concave-convex structure substrate may be an optical substrate.

According to a second aspect of the present invention, there is provided a solution used for producing the concave-convex structure substrate of the first aspect, including a sol-gel material containing at least one of tetraalkoxysilane, trialkoxysilane, and dialkoxysilane.

In the solution used for producing the concave-convex structure substrate of the first aspect, the sol-gel material may contain the tetraalkoxysilane and the dialkoxysilane.

In the solution used for producing the concave-convex structure substrate of the first aspect, the sol-gel material may contain the dialkoxysilane, and the dialkoxysilane may have a methyl group. The dialkoxysilane may be dimethyldiethoxysilane. Further, the sol-gel material may contain 15 to 35 mol % of the dialkoxysilane.

In the solution used for producing the concave-convex structure substrate of the first aspect, the sol-gel material may contain the tetraalkoxysilane, and the tetraalkoxysilane may be tetraethoxysilane.

In the solution used for producing the concave-convex structure substrate of the first aspect, the sol-gel material may contain the trialkoxysilane, and the trialkoxysilane may be methyltriethoxysilane or phenyltriethoxysilane.

In the solution used for producing the concave-convex structure substrate of the first aspect, the sol-gel material may further contain fluorine-containing alkoxysilane. Further, the sol-gel material may contain less than 1 mol % of the fluorine-containing alkoxysilane.

According to a third aspect of the present invention, there is provided a method for producing the concave-convex structure substrate of the first aspect, including:

coating a substrate with a concave-convex forming material to form a coating film;

drying the coating film;

pressing a roll-shaped mold having a concave-convex pattern against the dried coating film so as to press the concave-convex pattern against the coating film;

releasing the mold from the coating film; and baking the coating film to which the concave-convex pattern has been transferred.

According to a fourth aspect of the present invention, there is provided a method for producing an organic light emitting diode (organic EL element or organic Electro-Luminescence element), including:

successively stacking a transparent electrode, an organic layer, and a metal electrode on a concave-convex surface of a diffraction grating substrate having the concave-convex surface wherein the concave-convex structure substrate of the first aspect is used as the diffraction grating substrate.

The concave-convex structure substrate according to the present invention includes a concave-convex structure layer made of a certain sol-gel material, and thus this substrate is excellent in heat resistance and corrosion resistance and is also resistant to the process for manufacturing an element in which the substrate is incorporated. Further, the concave-convex structure substrate according to the present invention has a hydrophobic surface, and thus in the element in which the substrate is incorporated, moisture adsorption onto the surface of the substrate can be prevented, thereby making it possible to lengthen a service life of the element. Therefore, the concave-convex structure substrate according to the present invention is quite effective for various devices such as the organic EL elements and the solar cells.

BRIEF DESCRIPTION OF THE DRAWINGS

FIGS. 8A and 8B are tables indicating compositions of sol-gel material used in Examples and Comparative Examples and evaluation results of prepared samples.

FIG. 9A is a graph in which the contact angle of water is plotted against the ratio of MTES, DMDES, or PTES to all of the silica sources, and FIG. 9B is a graph in which the number of dark spots of the organic EL element is plotted against the ratio of MTES, DMDES, or PTES to all of the silica sources.

FIG. 11A is a plan view of the mold, FIG. 11B depicts a planer structure of one pattern partitioned or divided into three, and FIG. 11C is a cross-sectional view of a partitioned 400 nm pitch pattern.

DESCRIPTION OF THE PREFERRED EMBODIMENTS

An embodiment, of a substrate having a concave-convex pattern or concave-convex structure, a solution used for producing the substrate, and a method for producing the substrate, of the present invention will be explained below with reference to the drawings. In the following description, an optical substrate having a concave-convex structure is cited as an example of the substrate having the concave-convex structure or concave-convex pattern.

Figure 1:
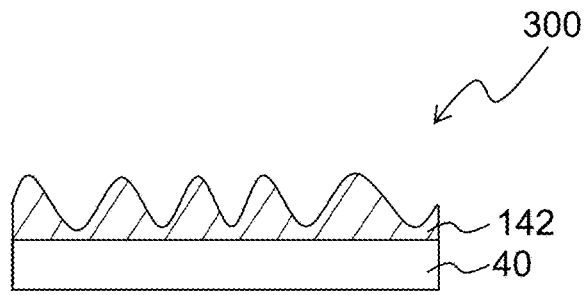
FIG. 1 is a schematic sectional view of a substrate having a concave-convex structure according to an embodiment of the present invention.

As depicted in FIG. 1, a substrate 300 having a concave-convex structure according to the present invention includes a concave-convex structure layer 142 which is made of a sol-gel material and formed on a base substrate 40. The sol-gel material constituting the concave-convex structure layer 142 has such a property that a contact angle of water on the sol-gel material in a flat and smooth film shape (a contact angle of water on a flat and smooth film shape formed of the sol-gel material) is not less than 80°. In the present application, "contact angle of water on a material in a flat and smooth film shape" means an angle formed by the surface of a flat and smooth film and the surface of a waterdrop under the condition that the flat and smooth film is formed of the material without any concavities and convexities, and that the waterdrop is formed on the surface of the flat and smooth film. Thus, as the greater contact angle of water on the flat and smooth film is greater, the surface of the flat and smooth film is more hydrophobic. The sol-gel material in this embodiment has sufficient hydrophobicity. Thus, when the substrate having the concave-convex structure in this embodiment is incorporated into an element such as organic EL, moisture can be eliminated easily from the substrate after the cleaning of the substrate, etc. in a process of producing the organic EL element. This allows the inside of the produced organic EL element to have low humidity and prevents the generation of dark spots (non-light emitting spots) in the organic EL element, thereby making it possible to extend the service life of the organic EL element. As is clear from Examples which will be described later, when the contact angle of water on the film made of sol-gel material exceeds at least 80°, the number of dark spots in the organic EL element manufactured by using the sol-gel material can be equivalent to or below the number of dark spots of organic EL manufactured by using no sol-gel material. The contact angle of water on the flat and smooth film formed of the sol-gel material can be measured by using a contact angle meter (for example, the model "CA-A" produced by Kyowa Interface Science Co., LTD.). Specifically, a substrate having the surface on which the flat and smooth film formed of the sol-gel material is formed is statically placed on a horizontal table of the contact angle meter; a syringe containing ion-exchanged water is set above the horizontal table of the contact angle meter; a waterdrop having a diameter of 2 mm is formed at the tip of the syringe; the horizontal table is moved up to bring the surface of the flat and smooth film into contact with the waterdrop; the horizontal table is moved down; and the waterdrop is statically placed on the surface of the flat and smooth film for 25 seconds. Here, an angle, which is formed by the surface of the flat and smooth film and the straight line connecting the top of the waterdrop and each of the left and right ends of the waterdrop, is obtained, and the contact angle of water is obtained by doubling the obtained angle.

When the sol-gel material contains tetraalkoxysilane and dialkoxysilane, it takes a shorter time to perform pre-baking described later, as in Examples which will be described later. Thus, it is preferred that the sol-gel material contain tetraalkoxysilane and dialkoxysilane. Further, it is preferred that the dialkoxysilane contain a methyl group. The reason thereof is as follows. Namely, a silanol group contained in alkoxysilane is hydrophilic, whereas the methyl group is hydrophobic. Thus, the alkoxysilane containing the methyl group allows the surface made of the sol-gel material to be hydrophobic sufficiently. When a mixture of tetraethoxysilane (TEOS) and dimethyldiethoxysilane (DMDES) is used as the sol-gel material, it is preferred that the DMDES content in the mixture be in a range of 15 to 35 mol %. When the DMDES content is less than 15 mol %, the sol-gel material has insufficient hydrophobicity. When the DMDES content exceeds 35 mol %, the DMDES separates in the solution, which makes it difficult to form the coating film made of the sol-gel material. It is possible to use, as the sol-gel material, a material containing fluorine-containing alkoxysilane such as perfluorodecyltriethoxysilane. In this case, it is preferred that the fluorine-containing alkoxysilane content in the sol-gel material be less than 1 mol %. When the fluorine-containing alkoxysilane content is not less than 1 mol %, the fluorine-containing alkoxysilane separates in the solution, which makes it difficult to form the coating film.

The concave-convex structure of the substrate according to the embodiment may be formed by any method. The concave-convex structure of the substrate according to the embodiment may have any pattern depending on the usage of the substrate. For example, the concave-convex structure may be a micro lens array structure and a structure having the light scattering function, light diffracting function, etc. The concave-convex structure, for example, may have an irregular concave-convex pattern in which pitches of concavities and convexities are non-uniform and the orientations of the concavities and convexities have no directionality. When the substrate having the concave-convex structure is used as the diffraction grating scattering or diffracting light in a visible region, the average pitch of the concavities and convexities is preferably in a range of 100 to 1,500 nm. When the average pitch of the concavities and convexities is less than the lower limit, the pitches are so small relative to wavelengths of the visible light that the diffraction of the light by the concavities and convexities is less likely to occur. When the average pitch exceeds the upper limit, the diffraction angle is so small that functions as an optical element such as the diffraction grating are more likely to be lost. The average pitch of the concavities and convexities is more preferably in a range of 200 to 1,200 nm. The average value of the depth distribution of the concavities and convexities is preferably in a range of 20 to 200 nm. When the average value of the depth distribution of concavities and convexities is less than the lower limit, the height is so short relative to the wavelengths of the visible light that the required diffraction is less likely to occur. On the other hand, when the average value exceeds the upper limit, the intensity of diffracted light becomes non-uniform, which in turn results in the following tendency. Namely, when this optical substrate is used, for example, as an optical substrate for the light extraction of an organic EL element, the electric field distribution in an EL layer becomes non-uniform, thereby causing the electric field to concentrate on a certain position or area in the EL layer and thus causing any leak current to be easily generated, and/or shortening the service life of the optical substrate. The average value of the depth distribution of the concavities and convexities is more preferably in a range of 30 to 150 nm. The standard deviation of the depth of convexities and concavities is preferably in a range of 10 to 100 nm. When the standard deviation of the depth of convexities and concavities is less than the lower limit, the height is so short relative to the wavelengths of the visible light that the required diffraction is less likely to occur. On the other hand, when the standard deviation exceeds the upper limit, the intensity of diffracted light becomes non-uniform, which in turn results in the following tendency. Namely, when this optical substrate is used, for example, as an optical substrate for the light extraction of an organic EL element, the electric field distribution in an EL layer becomes non-uniform, thereby causing the electric field to concentrate on a certain position or area in the EL layer and thus causing any leak current to be easily generated, and/or shortening the service life of the optical substrate. The standard deviation of the depth of convexities and concavities is more preferably in a range of 15 to 75 nm.

Note that the term "average pitch of the concavities and convexities" means an average value of the pitch of concavities and convexities in a case of measuring the pitch of the concavities and convexities (spacing distance between adjacent convex portions or spacing distance between adjacent concave portions) in a surface on which the convexities and concavities are formed. Such an average value of the pitch of concavities and convexities is obtained as follows. Namely, a concavity and convexity analysis image is obtained by measuring the shape of the concavities and convexities on the surface by using a scanning probe microscope (for example, a scanning probe microscope manufactured by Hitachi High-Tech Science Corporation, under the product name of "E-sweep", etc.), under the following measurement conditions, then the distances between randomly selected concave portions or convex portions adjacent to each other are measured at not less than 100 points in the concavity and convexity analysis image, and then the average of the distances is calculated and is determined as the average value of the pitch of concavities and convexities.

The measurement conditions are as follows:
Measurement mode: cantilever intermittent contact mode
Material of the cantilever: silicon
Lever width of the cantilever: 40 μm
Diameter of tip of chip of the cantilever: 10 nm Further, in the present application, the average value of the depth distribution of concavities and convexities and the standard deviation of the depth of concavities and convexities can be calculated by the following manner. Namely, a concavity and convexity analysis image is obtained by measuring the shape of the concavities and convexities on the surface by using a scanning probe microscope (for example, a scanning probe microscope manufactured by Hitachi High-Tech Science Corporation, under the product name of "E-sweep", etc.), in a randomly selected measurement region of 3 μm square (vertical: 3 μm, horizontal: 3 μm) or in a randomly selected measurement region of 10 μm square (vertical: 10 μm, horizontal: 10 μm) under the above-described conditions. When doing so, data of height of concavities and convexities at not less than 16,384 points (vertical: 128 points×horizontal: 128 points) are obtained within the measurement region, each in nanometer scale. Note that although the number of measurement points is different depending on the kind and setting of the measuring device which is used, for example in a case of using the above-described scanning probe microscope manufactured by Hitachi High-Tech Science Corporation, under the product name of "E-sweep", it is possible to perform the measurement at measurement points of 65,536 points (vertical: 256 points×horizontal: 256 points; namely, the measurement in a resolution of 256×256 pixels) within the measurement region of 3 μm square. With respect to the height of concavities and convexities (unit: nm) measured in such a manner, at first, a measurement point "P" is determined, among all the measurement points, which is the highest from the surface of a transparent supporting substrate. Then, a plane which includes the measurement point P and which is parallel to the surface of the transparent supporting substrate is determined as a reference plane (horizontal plane), and a depth value from the reference plane (difference obtained by subtracting, from the value of height from the transparent supporting substrate at the measurement point P, the height from the transparent supporting substrate at each of the measurement points) is obtained as the data of depth of concavities and convexities. Note that such a depth data of the concavities and convexities can be obtained, for example, by performing automatic calculation with software in the measurement device (for example, the above-described scanning probe microscope manufactured by Hitachi High-Tech Science Corporation, under the product name of "E-sweep"), and the value obtained by the automatic calculation in such a manner can be utilized as the data of depth of concavities and convexities. After obtaining the data of depth of concavity and convexity at each of the measurement points in this manner, the values, which can be calculated by obtaining the arithmetic average value and the standard deviation of the obtained data of depth of concavity and convexity, are adopted as the average value of the depth distribution of concavities and convexities and the standard deviation of the depth of concavities and convexities. In this specification, the average pitch of concavities and convexities and the average value of the depth distribution of concavities and convexities can be obtained via the above-described measuring method, regardless of the material of the surface on which the concavities and convexities are formed.

The light(s) scattered and/or diffracted by such a concave-convex pattern is/are a light having a wavelength in a relatively broad band, rather than a light having a single wavelength or a light having a wavelength in a narrow band, and the scattered and/or diffracted light(s) have no directivity, and travel(s) in various directions. Note that, however, the term "irregular concave-convex pattern" includes such a quasi-periodic structure in which a Fourier-transformed image, obtained by performing a two-dimensional fast Fourier-transform processing on a concavity and convexity analysis image obtained by analyzing a concave-convex shape on the surface, shows a circular or annular pattern, namely, such a quasi-periodic pattern in which, although the concavities and convexities have no particular orientation (directionality), the structure has the distribution of the pitches of concavities and convexities (the pitches of the concavities and convexities vary). Therefore, the substrate having such a quasi-periodic structure is suitable for a diffraction substrate used in a surface-emitting element etc., such as the organic EL element, a transparent conductive substrate of a solar cell, and the like, provided that the substrate has the concavities and convexities of which pitch distribution or pitch variability enables the substrate to diffract visible light.

Figure 2:
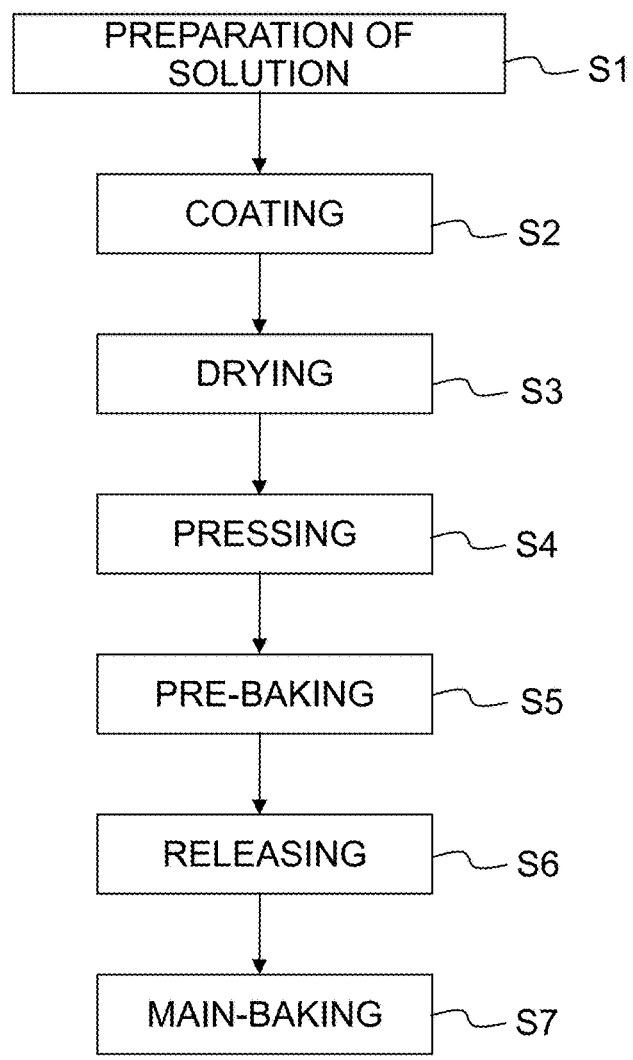
FIG. 2 is a flowchart showing a method for producing the substrate having the concave-convex structure according to the embodiment of the present invention.

As shown in FIG. 2, the method for producing the substrate having the concave-convex pattern or concave-convex structure according to the present invention mainly includes: a solution preparation step S1 for preparing a sol-gel material; a coating step S2 for coating the substrate with the prepared sol-gel material; a drying step S3 for drying a coating film of the sol-gel material with which the substrate is coated; a pressing step S4 for pressing a mold having a transfer pattern formed thereon against the coating film which has been dried for a predetermined time; a pre-baking (pre-calcination) step S5 for subjecting the coating film pressed with the mold to the pre-baking; a releasing (exfoliation or peeling off) step S6 for releasing (exfoliating or peeling off) the mold from the coating film; and a main baking (main calcination) step S7 for subjecting the coating film to main baking. The steps will be explained below sequentially. In the following explanation, the optical substrate having the concave-convex structure is cited as an example of the substrate having concave-convex pattern or the concave-convex structure.

[Sol-Gel Material Preparation Step]

In the method for producing the optical substrate according to the embodiment, the sol-gel material (sol solution or sol) is prepared so as to form the coating film to which the pattern is to be transferred by a sol-gel method (step S1 of FIG. 2). For example, when silica is synthesized on a substrate by the sol-gel method, a sol-gel material of metal alkoxide (silica precursor) is prepared. The silica precursor is exemplified by metal alkoxides including, for example, tetraalkoxide monomers represented by tetraalkoxysilane such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers represented by trialkoxysilane such as methyltrimethoxysilane, ethyltrimethoxysilane, propyltrimethoxysilane, isopropyltrimethoxysilane, phenyltrimethoxysilane, methyltriethoxysilane (MTES), ethyltriethoxysilane, propyltriethoxysilane, isopropyltriethoxysilane, phenyltriethoxysilane, methyltripropoxysilane, ethyltripropoxysilane, propyltripropoxysilane, isopropyltripropoxysilane, phenyltripropoxysilane, methyltriisopropoxysilane, ethyltriisopropoxysilane, propyltriisopropoxysilane, isopropyltriisopropoxysilane, phenyltriisopropoxysilane, hexyltrimethoxysilane, hexyltriethoxysilane, decyltrimethoxysilane, trifluoropropyltrimethoxysilane, octyltriethoxysilane, perfluorodecyltriethoxysilane, 4-trifluoro methylphenyltriethoxysilane, and tolyltriethoxysilane; dialkoxide monomers represented by dialkoxysilane such as dimethyldiethoxysilane, diethoxydiphenylsilane, and diethoxydimethylsilane; monomers having vinyl group such as vinyltrimethoxysilane and vinyltriethoxysilane; monomers having epoxy group such as 2-(3,4-epoxycyclohexyl) ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane; monomers having styryl group such as p-styryltrimethoxysilane; monomers having methacrylic group such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; monomers having acrylic group such as 3-acryloxypropyltrimethoxysilane; monomers having amino group such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, and N-phenyl-3-aminopropyltrimethoxysilane; monomer having ureide group such as 3-ureidepropyltriethoxysilane; monomers having mercapto group such as 3-mercaptopropylmethyldimethoxysilane and 3-mercaptopropyltrimethoxysilane; monomers having sulfide group such as bis(triethoxysilylpropyl) tetrasulfide; monomers having isocyanate group such as 3-isocyanatopropyltriethoxysilane; polymers obtained by polymerizing the foregoing monomers in small amounts; and composite materials characterized in that functional group and/or polymer is/are introduced into a part of the material as described above. Further, a part of or all of the alkyl group and the phenyl group may be substituted with fluorine. Further, examples of the silica precursor include metal acetylacetonate, metal carboxylate, oxychloride, chloride, and mixtures thereof. The silica precursor, however, is not limited thereto. In addition to Si, examples of the metal species include Ti, Sn, Al, Zn, Zr, In, and mixtures thereof, but are not limited thereto. It is also possible to use any appropriate mixture of precursors of the oxides of the above metals. Further, it is possible to use, as the silica precursor, a silane coupling agent having, in its molecule, a hydrolysis group having the affinity and the reactivity with silica and an organic functional group having the water-repellence. For example, there are exemplified silane monomer such as n-octyltriethoxysilane, methyltriethoxysilane, and methyltrimethoxysilane; vinylsilane such as vinyltriethoxysilane, vinyltrimethoxysilane, vinyltris(2-methoxyethoxy)silane, and vinylmethyldimethoxysilane; methacrylsilane such as 3-methacryloxypropyltriethoxysilane and 3-methacryloxypropyltrimethoxysilane; epoxysilane such as 2-(3,4-epoxycyclohexyl)ethyltrimethoxysilane, 3-glycidoxypropyltrimethoxysilane, and 3-glycidoxypropyltriethoxysilane; mercaptosilane such as 3-mercaptopropyltrimethoxysilane and 3-mercaptopropyltriethoxysilane; sulfursilane such as 3-octanoylthio-1-propyltriethoxysilane; aminosilane such as 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, and 3-(N-phenyl)-aminopropyltrimethoxysilane; and polymers obtained by polymerizing the monomers as described above.

The sol-gel material containing the tetraalkoxysilane and dialkoxysilane can form a film having both the hydrophobicity and film forming property, as will be described in Examples. It is preferred that the dialkoxysilane contain the methyl group. By doing so, although the silanol group generated by the hydrolysis of alkoxysilane is hydrophilic, the methyl group which is hydrophobic allows the surface of the sol-gel material to have sufficient hydrophobicity. When the mixture of tetraethoxysilane (TEOS) and dimethyldiethoxysilane (DMDES) is used as the sol-gel material, it is preferred that the DMDES content be in a range of 15 to 35 mol %. When the DMDES content is less than 15 mol %, the sol-gel material has insufficient hydrophobicity. When the DMDES content exceeds 35 mol %, the DMDES separates in the solution, which makes it difficult to form the coating film of the sol-gel material. The material containing fluorine-containing alkoxysilane such as perfluorodecyltriethoxysilane can be used as the sol-gel material. In this case, it is preferred that the fluorine-containing alkoxysilane content in the sol-gel material be less than 1 mol %. When the fluorine-containing alkoxysilane content is not less than 1 mol %, the fluorine-containing alkoxysilane separates in the solution, which makes it difficult to form the coating film.

The sol-gel material produces amorphous silica by being subjected to the hydrolysis and polycondensation reaction. An acid such as hydrochloric acid or an alkali such as ammonia is added in order to adjust the pH of the solution as a synthesis condition. The pH is preferably not more than 4 or not less than 10. Water may be added to perform the hydrolysis. The amount of water to be added can be not less than 1.5 times, with respect to the amount of metal alkoxide species, in the molar ratio. It is also possible to use, as the sol-gel material, a material other than the silica. For example, a titanium-based material, a material based on indium tin oxide (ITO), $Al_2O_3$, $ZrO_2$, ZnO, $TiO_2$, ZnS, ZrO, $BaTiO_3$, $SrTiO_2$, etc. may be used.

The solvent for the sol-gel material is exemplified, for example, by alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; water; and mixture solvents thereof. Especially, ethanol and isopropyl alcohol are preferable. Further, a mixture of water and ethanol and a mixture of water and isopropyl alcohol are also preferable.

As an additive of the sol-gel material, it is possible to use polyethylene glycol, polyethylene oxide, hydroxypropylcellulose, and polyvinyl alcohol for viscosity adjustment; alkanolamine such as triethanolamine, β-diketone such as acetylacetone, β-ketoester, formamid, dimetylformamide, dioxane, and the like, as a solution stabilizer.

Note that it is allowable to use a photo-curable sol-gel material, other than using the sol-gel material which is cured by being heated. In such a case, it is possible to adopt, for example, a method in which photo-acid generator such as hexafluorophosphate aromatic sulfonium salt which generates acid by light is used, or a method in which chemical modification (chelation) is caused by adding β-diketone represented by acetylacetone to a sol and the chemical modification is removed by being irradiated with light.

[Coating Step]

The substrate is coated with the sol-gel material prepared as described above (step S2 of FIG. 2). As the substrate, substrates made of inorganic materials such as glass, silica glass, and silicon substrates or substrates of resins such as polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate may be used. The substrate may be transparent or opaque. If a substrate having the concave-convex pattern obtained by using this substrate is used for production of the organic EL element as will be described later, this substrate desirably has the heat resistance, the light resistance against ultraviolet (UV) light, and the like. In these respects, substrates made of inorganic materials such as glass, silica glass, and silicon substrates are more preferable. It is allowable to perform a surface treatment or provide an easy-adhesion layer on the substrate in order to improve an adhesion property, and to provide a gas barrier layer in order to keep out moisture and/or gas such as oxygen. As the coating method, it is possible to use any coating method including, for example, a bar coating method, a spin coating method, a spray coating method, a dip coating method, a die coating method, and an ink-jet method. The bar coating method, the die coating method, and the spin coating method are preferable, because the substrate having a relatively large area can be coated uniformly with the sol-gel material and the coating can be quickly completed prior to curing (gelation) of the sol-gel material. It is noted that, since a sol-gel material layer with a desired concave-convex pattern is formed in subsequent steps, the surface of the substrate (including the surface on which the surface treatment has been performed or the easy-adhesion layer if the surface treatment has been performed or the easy-adhesion layer has been formed) may be flat, and the substrate itself does not have the desired concave-convex pattern.

[Drying Step]

After the coating step, the substrate is kept (held) in the atmospheric air or under reduced pressure in order to evaporate the solvent contained in the coating film (hereinafter also referred to as "sol-gel material layer" as appropriate) (step S3 of FIG. 2). When the holding time of the substrate is short, the viscosity of the coating film is too low to transfer the concave-convex pattern in the subsequent pressing step. When the holding time of the substrate is too long, the polymerization reaction of the precursor proceeds too much and thus the concave-convex pattern cannot be transferred in the pressing step. After the coating of the sol-gel material, the polymerization reaction of the precursor proceeds as the evaporation of the solvent proceeds, and the physical property such as the viscosity of sol-gel material also changes in a short time. From the viewpoint of the stability of concave-convex pattern formation, it is preferred that drying time which enables a good pattern transfer have a sufficiently wide range. The range of the drying time which enables a good pattern transfer can be adjusted by the drying temperature (holding temperature), the drying pressure, the kind of sol-gel material, the ratio of mixed sol-gel materials, the solvent amount used at the time of preparation of the sol-gel material (concentration of sol-gel material), etc. Although the preferred drying time which enables a good pattern transfer depends on the device to be used etc., the drying time is preferably in a range of 30 to 300 seconds. When the drying time which enables a good pattern transfer is less than 30 seconds, the coated substrate can not be transported to a device which subsequently performs pressing, in time. When the drying time which enables a good pattern transfer exceeds 300 seconds, the drying step takes a long time and results in decreasing the productivity of the substrate in some cases. It is preferred that the holding temperature stay constant in a range of 10 to 100° C., more preferably in a range of 10 to 30° C. When the holding temperature is higher than this range, the gelation reaction of the coating film proceeds rapidly before the pressing step, which is not preferable. When the holding temperature is lower than this range, the gelation reaction of the coating film proceeds slowly before the pressing step, which reduces the productivity and is not preferable.

[Pressing Step]

After the drying step, the mold having a predetermined fine concave-convex pattern is pressed against the coating film by using a pressing roll (step S4 of FIG. 2). The roll process using the pressing roll has the following advantages over the pressing system. Namely, (i) the period of time during which the mold and the coating film are brought in contact with each other is short, and hence it is possible to prevent any deformation or collapse of pattern which would be otherwise caused by the difference in coefficient of thermal expansion among the mold, the substrate, and a stage in which the substrate is placed, etc.; (ii) the roll process enables the continuous process to improve the productivity, and the use of a long mold further improves the productivity; iii) it is possible to prevent the generation of bubbles of gas in the pattern due to the bumping of the solvent in the sol-gel material or to prevent any trace or mark of gas from remaining; iv) it is possible to reduce the transfer pressure and the releasing force (peeling force) owing to the line contact with the substrate (coating film), thereby making it possible to easily handle a substrate with larger area; and v) no bubble is included during the pressing.

Although any roll can be used as the pressing roll, the pressing roll is preferably a roll having a coating film, which is provided on a surface thereof and which is made of a resin material such as ethylene-propylene-diene rubber (EPDM), silicone rubber, nitrile rubber, fluoro rubber, acrylic rubber, chloroprene rubber, etc. Further, a supporting roll may be provided to face the pressing roll and to sandwich the substrate between the supporting roll and the pressing roll, or a supporting stand configured to support the substrate may be provided, for the purpose of resisting the pressure applied by the pressing roll.

When the mold is pressed with the pressing roll, the pressing roll can be moved and rotated relative to the surface of the coating film while the surface of the coating film on the substrate is being covered with the mold. Alternatively, it is allowable to use, as the press roll, a roll having the mold previously wound on the outer circumference thereof.

The coating film may be heated when the mold is pressed against the coating film by use of the pressing roll. Heating promotes the chemical reaction in the coating film and the evaporation of the solvent and water generated by the chemical reaction, thereby facilitating the curing of the coating film. The heating of the coating film may be performed, for example, through or via the pressing roll, from the side of the substrate, or directly. When the heating through the pressing roll is performed, a heating means may be provided in the pressing roll, and any heating means can be used. Although it is preferred that a heater be included in the pressing roll, the heater may be provided separately from the pressing roll. Any pressing roll may be used, provided that the coating film can be brought in contact with the mold while heated. The heating temperature of the coating film may be in a range of room temperature to 300° C., particularly in a range of room temperature to 200° C. When the heating is performed by use of the pressing roll, the heating temperature of the pressing roll may be similarly in a range of room temperature to 300° C., particularly in a range of room temperature to 200° C. Heating the pressing roll as described above enables the mold to be easily released (peeled off) from the coating film against which the mold has been pressed, thereby making it possible to improve the productivity. When the heating temperature of the coating film or the pressing roll exceeds 300° C., the heating temperature is liable to exceed the heat-resisting temperature of the mold made of the resin material. By performing the pressing while heating the coating film, it is possible to expect the effect similar to that obtained by pre-baking of the sol-gel material layer, as described below. When a photo-curable sol-gel material is used in the coating film, the gelation (curing) can be promoted by irradiation with light, instead of the heating of the coating film.

[Mold Used in Pressing Step and Method for Producing Mold]

The mold used in this embodiment is flexible like a film-shaped mold and has a concave-convex transfer pattern on a surface thereof. Examples of those usable as the material for the mold include organic materials such as silicone resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate; metallic materials such as nickel, copper, and aluminium; and inorganic materials such as glass. Examples of the material are not limited to those, and any material can be used. The concave-convex pattern may be formed directly in each of the materials, or may be formed of another material with which a base material formed of the above-material(s) is coated or covered. It is possible to use photo-curable resin, thermosetting resin, and thermoplastic resin as another material. A surface treatment or an easy-adhesion treatment may be performed between the base material and another material in order to improve the adhesion property. Further, a mold-release treatment may be performed on each concave-convex pattern surface as needed. The concave-convex pattern may be formed to have any profile by an arbitrary method.

The concave-convex pattern of the mold may be any pattern depending on the usage of the optical substrate as a finally obtained product. For example, the concave-convex pattern may have a lens array structure or a structure having the light scattering function, light diffracting function, etc. The concave-convex pattern, for example, may be an irregular concave-convex pattern in which pitches of concavities and convexities are non-uniform and the orientations of the concavities and convexities have no directionality. When the optical substrate is used as the diffraction grating scattering or diffracting light in a visible region, the average pitch of the concavities and convexities of the mold is preferably in a range of 100 to 1,500 nm. When the average pitch of the concavities and convexities is less than the lower limit, the pitches are so small relative to the wavelengths of the visible light that the diffraction of light by the concavities and convexities is likely to occur. On the other hand, when the average pitch exceeds the upper limit, the diffraction angle is so small that the functions as an optical element such as the diffracting grating are more likely to be lost. The average pitch of the concavities and convexities is more preferably in a range of 200 to 1,200 nm. The average value of depth distribution of concavities and convexities of the mold is preferably in a range of 20 to 200 nm. When the average value of the depth distribution of concavities and convexities is less than the lower limit, the height is so short relative to the wavelengths of the visible light that the required diffraction is less likely to occur. On the other hand, when the average value exceeds the upper limit, the intensity of diffracted light becomes non-uniform, which in turn results in the following tendency. Namely, when the optical substrate manufactured by using the mold is used, for example, as an optical substrate for the light extraction of an organic EL element, the electric field distribution in an EL layer becomes non-uniform, thereby causing the electric field to concentrate on a certain position or area in the EL layer and thus causing any leak current to be easily generated, and/or shortening the service life of the optical substrate. The average value of the depth distribution of the concavities and convexities is more preferably in a range of 30 to 150 nm. The standard deviation of the depth of convexities and concavities is preferably in a range of 10 to 100 nm. When the standard deviation of the depth of convexities and concavities is less than the lower limit, the height is so short relative to the wavelengths of the visible light that the required diffraction is less likely to occur. On the other hand, when the standard deviation exceeds the upper limit, the intensity of diffracted light becomes non-uniform, which in turn results in the following tendency. Namely, when this optical substrate is used, for example, as an optical substrate for the light extraction of an organic EL element, the electric field distribution in an EL layer becomes non-uniform, thereby causing the electric field to concentrate on a certain position or area in the EL layer and thus causing any leak current to be easily generated, and/or shortening the service life of the optical substrate. The standard deviation of the depth of convexities and concavities is more preferably in a range of 15 to 75 nm.

An explanation will be made about an exemplary method for producing the mold used in this embodiment. A master block pattern for forming the concave-convex pattern of the mold is manufactured first. It is preferred that the concave-convex pattern of the master block be formed by a method of utilizing the self-organization or self-assembly (micro phase separation) of a block copolymer described in International Publication No. WO2012/096368 of the applicants of the present invention (hereinafter referred to as "BCP (Block Copolymer) method" as appropriate), a method of heating and cooling a vapor deposited film on a polymer film to form concavities and convexities of wrinkles on a surface of polymer, as disclosed in International Publication No. WO2011/007878 A1 of the applicants of the present invention (hereinafter referred to as "BKL (Buckling) method" as appropriate), etc. The photolithography method may be utilized instead of the BCP and BKL methods. In addition to the above methods, the concave-convex pattern of the master block can be manufactured by, for example, microfabrication or fine-processing methods including a cutting (cutting and processing) or machining method, an electron-beam direct imaging method, a particle beam processing method, a scanning probe processing method, and a fine-processing method using the self-organization or self-assembly of fine particles, etc. When the pattern is formed by the BCP method, although the pattern made of any material can be used, the material is preferably a block copolymer composed of a combination of two selected from the group consisting of a styrene-based polymer such as polystyrene; polyalkyl methacrylate such as polymethyl methacrylate; polyethylene oxide; polybutadiene; polyisoprene; polyvinylpyridine; and polylactic acid.

After forming the master block with the pattern by means of the BCP or BKL method, further, a mold to which the pattern is transferred can be formed by an electroforming method or the like, as follows. At first, a seed layer functioning as an electroconductive layer for an electroforming process can be formed on the master block, which has the pattern to be transferred, by means of non-electrolytic plating, sputtering, vapor deposition, or the like. The thickness of the seed layer is preferably not less than 10 nm to uniformize a current density during the subsequent electroforming process, and thereby making the thickness of a metal layer accumulated by the subsequent electroforming process uniform. As the material of the seed layer, it is possible to use, for example, nickel, copper, gold, silver, platinum, titanium, cobalt, tin, zinc, chrome, gold-cobalt alloy, gold-nickel alloy, boron-nickel alloy, solder, copper-nickel-chromium alloy, tin-nickel alloy, nickel-palladium alloy, nickel-cobalt-phosphorus alloy, or alloy thereof. Subsequently, a metal layer is accumulated on the seed layer by the electroforming (electroplating). The entire thickness of the metal layer including the thickness of the seed layer can be, for example, in a range of 10 to 3000 μm. As the material of the metal layer accumulated by the electroforming, it is possible to use any of metal species as described above which can be used as the seed layer. Nickel is preferred as the material of the metal layer in view of the wear resistance, the releasing property, and the like of a metal substrate to be obtained as the mold. In this case, nickel is also preferably used for the seed layer. Considering ease of the subsequent processes for forming the mold such as pressing to the resin layer, releasing, and cleaning, the formed metal layer desirably has appropriate hardness and thickness.

The metal layer including the seed layer obtained as described above is released (peeled off) from the master block having the concave-convex structure to obtain a metal substrate. As the releasing method, the metal layer may be peeled off physically, or the materials composing the pattern of the master block may be dissolved to be removed by using an organic solvent dissolving them, such as toluene, tetrahydrofuran (THF), and chloroform. When the metal substrate is peeled off from the master block, a remaining material component on the metal substrate can be removed by cleaning. As the cleaning method, it is possible to use wet cleaning using a surfactant etc., or dry cleaning using ultraviolet rays and/or plasma. Alternatively, for example, the remaining material component may be attached to or adhere to an adhesive agent or a bonding agent then be removed. Accordingly, the metal substrate to which the pattern has been transferred from the master block can be obtained.

A flexible mold such as the film-shaped mold can be manufactured by transferring the concave-convex structure (pattern) of the obtained metal substrate to a film-shaped supporting substrate. For example, after curable resin is applied on the supporting substrate, the resin layer is cured while the concave-convex structure of the metal substrate is being pressed against the resin layer. The supporting substrate is exemplified, for example, by base members made of inorganic materials such as glass; base members made of organic materials such as silicon resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate; and metallic materials such as nickel, copper, and aluminium. The thickness of the supporting substrate may be in a range of 1 to 500 μm.

The curable resin can be exemplified by resins such as photocurable resins, thermosetting resins, moisture curing type resins, chemical curing type resins (two-liquid mixing type resins), etc. Specifically, the curable resin can be exemplified by various resins including, for example, monomers, oligomers, and polymers of those based on epoxy, acrylic, methacrylic, vinyl ether, oxetane, urethane, melamine, urea, polyester, polyolefin, phenol, cross-linking type liquid crystal, fluorine, silicone, polyamide, etc. The thickness of the curable resin is preferably in a range of 0.5 to 500 μm. When the thickness is less than the lower limit, heights of the concavities and convexities formed on the surface of the cured resin layer are likely to be insufficient. When the thickness exceeds the upper limit, the influence of volume change of the resin upon curing is likely to be so large that the formation of the shape of the concavities and convexities is liable to be unsatisfactory.

As a method for coating the supporting substrate with the curable resin, for example, it is possible to adopt various coating methods such as the spin coating method, spray coating method, dip coating method, dropping method, gravure printing method, screen printing method, relief printing method, die coating method, curtain coating method, ink-jet method, and sputtering method. Further, the condition for curing the curable resin varies depending on the kind of the resin to be used. For example, the curing temperature is preferably in a range of room temperature to 250° C., and the curing time is preferably in a range of 0.5 minute to 3 hours. Alternatively, a method may be employed in which the curable resin is cured by being irradiated with energy ray such as ultraviolet light or electron beam. In such a case, the amount of the irradiation is preferably in a range of 20 mJ/cm$^2$ to 5 J/cm$^2$.

Subsequently, the metal substrate is detached from the curable resin layer after the curing. The method for detaching the metal substrate is not limited to a mechanical releasing (exfoliating or peeling off) method, and any known method can be adopted. Accordingly, it is possible to obtain a mold with the resin film having the cured resin layer in which the concavities and convexities are formed on the supporting substrate.

Figure 3:
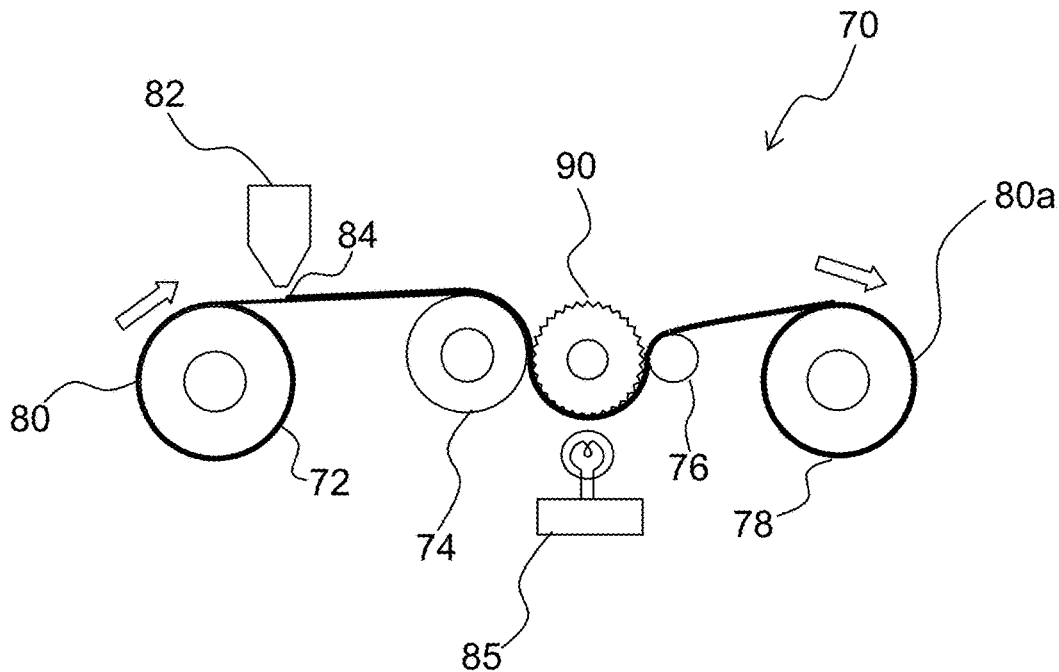
FIG. 3 conceptually depicts an apparatus for producing a film-shaped mold through a roll process.

FIG. 3 depicts an example of a roll process for manufacturing the flexible mold, such as the film-shaped mold, by use of the metal substrate. A roll process apparatus 70 depicted in FIG. 3 mainly includes a transport system of a substrate film 80 such as PET, a die coater 82 for applying UV curable resin on the substrate film 80 during transportation, a metal roll (metal mold) 90 which is positioned on the downstream side of the die coater 82 and transfers a pattern, and a radiation light source 85 which is provided to face the metal roll 90 with the substrate film 80 intervening therebetween and emits UV light to the substrate film 80. The metal roll 90 may be a metal roll having the pattern directly formed thereon, a metal roll in which the metal substrate is wound on and fixed to the roll, a metal roll formed by manufacturing a cylindrical metal substrate and fitting and fixing the substrate to the roll, or the like. The transport system includes a film feeding roll 72 which feeds the substrate film 80, a nip roll 74 and a peeling roll 76 which are arranged on the upstream and downstream sides of the metal roll 90 respectively and urge the substrate film 80 toward the metal roll 90, and a winding roll 78 which winds or rolls up a substrate film 80*a* having the pattern transferred thereon. The substrate film 80 wound on the film feeding roll 72 is fed to the downstream side by rotation of the film feeding roll 72, then a UV curable resin 84 is applied on the upper surface of the substrate film 80 by the die coater 82 to have a predetermined thickness. The metal roll 90 is pressed against the UV curable resin 84 on the substrate film 80 by the nip roll 74, so that the concave-convex pattern of the metal roll 90 is transferred to the UV curable resin 84, and at the same time or immediately after the above, the UV light is emitted from the radiation light source 85 to cure the UV curable resin 84. After peeling off the substrate film 80*a* with the UV curable resin having the cured pattern from the metal roll 90 by use of the peeling roll 76, the substrate film 80*a* is wound around the winding roll 78. Accordingly, a long and flexible mold 80*a* is obtained. Such a long mold is suitable for the transfer process (nanoimprint) using the pressing roll according to the present invention.

[Pre-Baking Step]

After the mold is pressed against the coating film (sol-gel material layer), the coating film may be subjected to pre-baking (step S5 of FIG. 2). The pre-baking promotes gelation of the coating film to solidify the pattern, which allows the pattern to be less likely to be collapsed during releasing or peeling. When the pre-baking is performed, heating is preferably performed at temperatures of room temperature to 300° C. (e.g., 40 to 150° C.) in the atmosphere. Noted that, it is not indispensable to perform the pre-baking. When the photo-curable sol-gel material is used for the coating film, the gelation (curing) may be facilitated by light irradiation instead of the heating of the coating film.

[Releasing Step]

Figure 4:
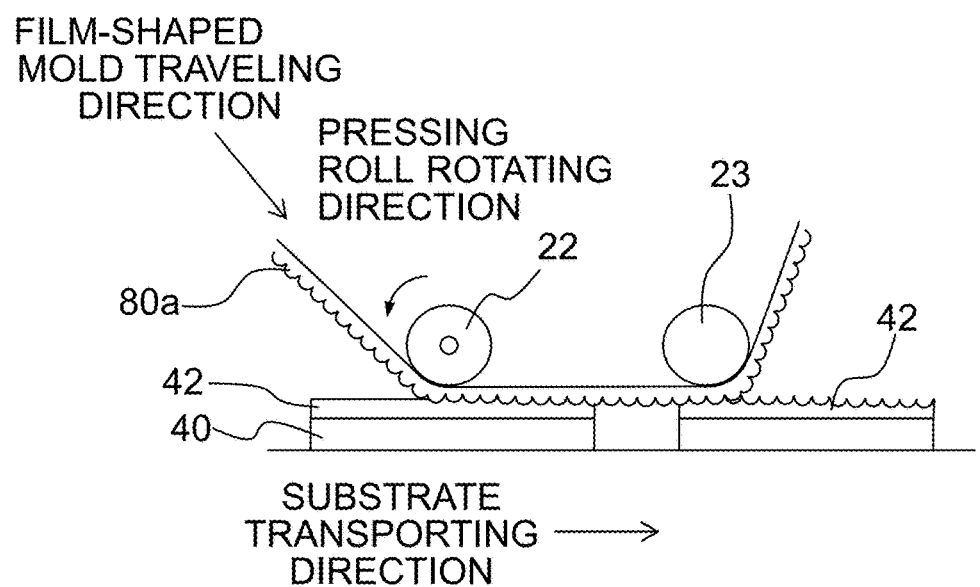
FIG. 4 is a conceptual view for illustrating the roll process using the film-shaped mold.

The mold is released or peeled off from the coating film (sol-gel material layer) after the pressing step or the pre-baking step (step S6 of FIG. 2). Since the roll process is used in this embodiment, the releasing force (peeling force) may be smaller than that in the pressing system using a plate-shaped mold, and it is possible to easily release the mold from the coating film without remaining the coating film on the mold. In particular, since the pressing is performed while the coating film is being heated, reaction is more likely to progress, which facilitates the releasing of the mold from the coating film immediately after the pressing. In order to improve the releasing property (peeling property) of the mold, it is possible to use a peeling roll (releasing roll). As depicted in FIG. 4, a peeling roll (releasing roll) 23 disposed on the downstream side of a pressing roll 22 rotates and supports a film-shaped mold 80*a* while urging the film-shaped mold 80*a* toward a coating film 42. This can maintain a state in which the film-shaped mold 80*a* is attached to the coating film 42 by a distance between the pressing roll 22 and the peeling roll 23 (for a certain period of time). Then, a path of the film-shaped mold 80*a* is changed so that the film-shaped mold 80*a* is pulled up above the peeling roll 23 on the downstream side of the peeling roll 23, thereby peeling off (releasing) the film-shaped mold 80*a* from the coating film 42. The pre-baking or the heating may be performed during a period in which the film-shaped mold 80*a* is attached to the coating film 42. When the peeling roll 23 is used, the releasing of the coating film 42 becomes easier by releasing the coating film 42 from the mold 80*a* while heating the coating film 42, for example, at temperatures of room temperature to 300° C., especially at temperatures of room temperature to 200° C. The heating temperature of the peeling roll 23 may be higher than the heating temperature of the pressing roll 22 and/or the pre-baking temperature. When the coating film 42 is released while being heated at high temperature, gas generated from the coating film 42 is allowed to escape, thereby preventing the generation of bubbles.

[Main Baking Step (Curing Step)]

After the mold is released from the coating film (sol-gel material layer) 42 on the base substrate 40, the coating film 42 is subjected to main baking (step S7 of FIG. 2). The hydroxyl group and the like contained in the coating film 42 is desorbed or eliminated by the main baking to further harden (solidify) the coating film 42. It is preferred that the main baking be performed at temperatures of 200 to 1,200° C. for about 5 minutes to about 6 hours. In such a manner, the coating film 42 is cured, and the substrate with the concave-convex pattern film which corresponds to the concave-convex pattern of the mold is obtained, namely the substrate in which the concave-convex structure layer 142 made of the sol-gel material is directly formed on the flat substrate 40 (as depicted in FIG. 1) is obtained. In this situation, the coating film (sol-gel material layer) 42 is amorphous, crystalline, or in a mixture state of the amorphous and the crystalline, depending on the baking temperature and baking time. Further, when a material, which generates an acid or alkali by irradiation with light such as ultraviolet rays, is added to a solution of the sol-gel material, the concave-convex structure layer can be cured by irradiation with energy rays represented by ultraviolet rays such as excimer UV light, instead of the baking of the concave-convex structure layer.

In the coating step, the substrate may be coated with a solution of the sol-gel material such as $TiO_2$, ZnO, ZnS, ZrO, $BaTiO_3$, or $SrTiO_2$, or a dispersion liquid of fine particles. Of the above materials, $TiO_2$ is preferably used in view of the film formation performance (coating property) and the refractive index. The coating film made of inorganic material may be formed by a liquid phase deposition (LPD) and the like.

Alternatively, the substrate may be coated with a polysilazane solution in the coating step. In this case, a concave-convex structure layer made of silica may be obtained by forming the coating film, which is formed by applying the polysilazane solution, into ceramic (silica reforming or modification) in the curing step. It is noted that "polysilazane" is a polymer having a silicon-nitrogen bond, is an inorganic polymer comprising Si—N, Si—H, N—H, or the like, and is a precursor of a ceramics such as $SiO_2$, $Si_3N_4$, or $SiO_xN_y$, which is an intermediate solid solution of them. A compound, which is ceramized at relatively low temperature and is modified into silica, is more preferred. For example, a compound, which is represented by the following formula (1) described in Japanese Patent Application Laid-open No. H8-112879, is more preferable.

    Formula (1):

In the formula (1), R1, R2, and R3 each represent a hydrogen atom, an alkyl group, an alkenyl group, a cycloalkyl group, an aryl group, an alkylsilyl group, an alkylamino group, or an alkoxy group.

Of the compounds represented by the formula (1), per-hydropolysilazane (referred to also as PHPS) in which all of R1, R2, and R3 are hydrogen atoms and organopolysilazane in which a part of the hydrogen bonded to Si thereof is substituted by, for example, an alkyl group are particularly preferred.

Other examples of the polysilazane ceramized at low temperature include: silicon alkoxide-added polysilazane obtained by reacting polysilazane with silicon alkoxide (for example, Japanese Patent Laid-Open No. 5-238827); glycidol-added polysilazane obtained by reaction with glycidol (for example, Japanese Patent Laid-open No. 6-122852); alcohol-added polysilazane obtained by reaction with alcohol (for example, Japanese Patent Laid-open No. 6-240208); metal carboxylate-added polysilazane obtained by reaction with metal carboxylate (for example, Japanese Patent Laid-Open No. 6-299118); acetylacetonato complex-added polysilazane obtained by reaction with an acetylacetonato complex containing a metal (for example, Japanese Patent Laid-Open No. 6-306329); metallic fine particles-added polysilazane obtained by adding metallic fine particles (for example, Japanese Patent Laid-Open No. 7-196986), and the like.

As the solvent of the polysilazane solution, it is possible to use hydrocarbon solvents such as aliphatic hydrocarbons, alicyclic hydrocarbons, and aromatic hydrocarbons; halogenated hydrocarbon solvents; and ethers such as aliphatic ethers and alicyclic ethers. Amine or a metal catalyst may be added in order to promote the modification into a silicon oxide compound.

<Manufacturing Apparatus of Optical Substrate>

Figure 5:
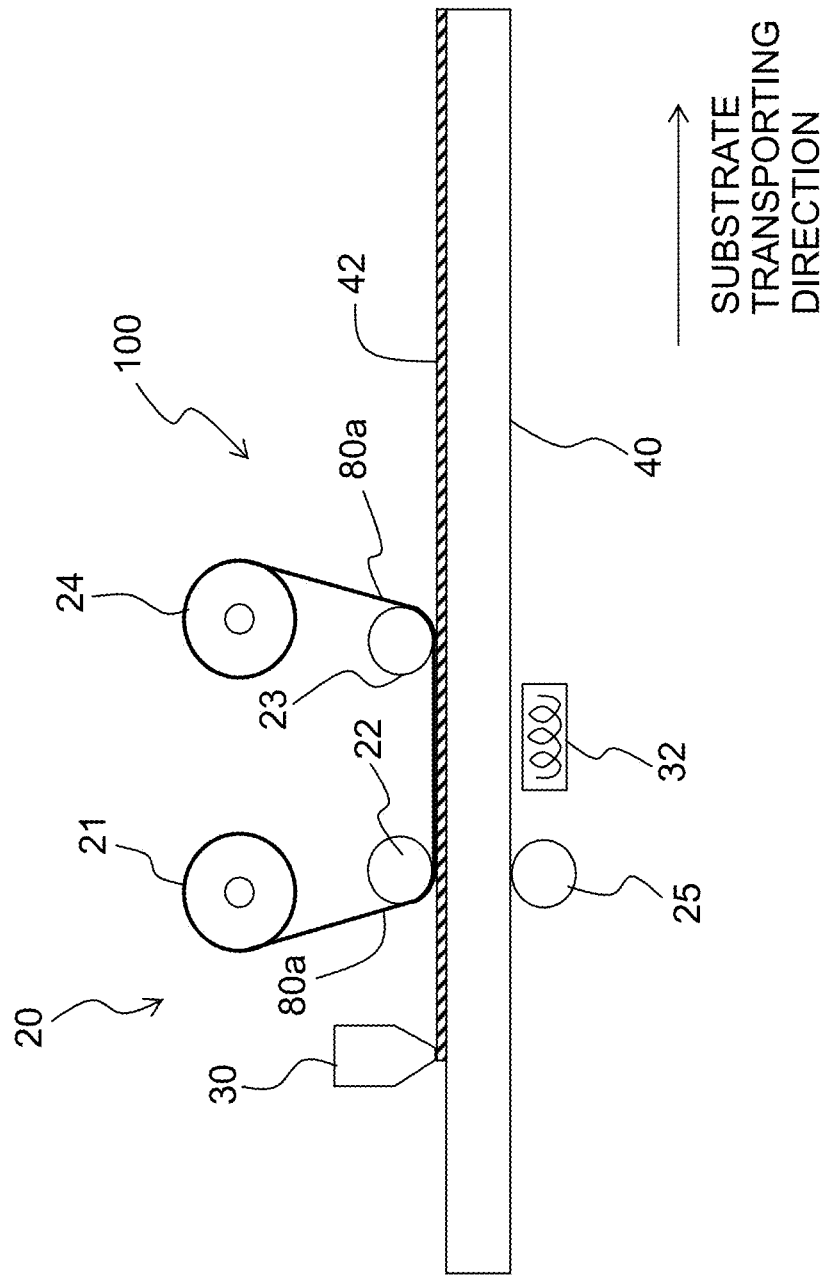
FIG. 5 conceptually depicts an apparatus used for producing the substrate according to the embodiment of the present invention.

In order to carry out the method of the present invention, it is possible to use, for example, an apparatus 100 for manufacturing the substrate having the concave-convex pattern, as depicted in FIG. 5. The apparatus 100 mainly includes a die coater 30 coating a substrate 40 with sol; a transport system 20 transporting a long mold 80a; and a heater 32 heating a coating film 42. The transport system 20 includes a feeding roll 21 which feeds the mold 80a; a pressing roll 22 which presses the mold 80a to the side of the coating film 42 formed on the substrate 40; a supporting roll 25 which is provided to face the pressing roll 22 to press the substrate 40 from the lower side of the substrate and which is rotationally driven to feed the substrate 40 to the downstream side in a substrate transporting direction; a peeling roll 23 which is provided on the downstream side of the pressing roll 22 to release the mold 80a after a state, in which the mold 80a is pressed against the coating film 42 on the substrate 40, is maintained over a predetermined distance; and a winding roll 24 which is provided on the downstream side of the peeling roll 23 to wind or roll up the mold 80a. The heater 32 is used for the pre-baking and is positioned between the pressing roll 22 and the peeling roll 23 in the substrate transporting direction. It is possible to use, for example, an infrared heater, hot-air heating, and a hot plate as the heater 32.

An explanation will be made about an operation for processing the substrate by use of the apparatus 100. The substrate 40 is coated with the sol-gel material by the die coater 30 while the substrate 40 sandwiched between the pressing roll 22 and the supporting roll 25 is being moved to the downstream side. The coating film 42 obtained by applying the sol-gel material arrives at the pressing roll 22 after the elapse of a predetermined moving time of the substrate 40 and then the concave-convex pattern of the mold 80a fed by the feeding roll 21 is pressed against the coating film 42. The substrate 40 is transported in a state that the concave-convex pattern of the mold 80a is pressed against the coating film 42, and the coating film 42 is subjected to the pre-baking when passing above the heater 32. The mold 80a is drawn or pulled upward by the winding roll 24 when passing through the peeling roll 23, thereby releasing the mold 80a from the coating film 42. Subsequently, the substrate on which the pattern is formed is subjected to the main baking in an oven provided separately from the apparatus 100. As the oven used for the main baking, a heater may be provided in the manufacturing line.

Figure 6:
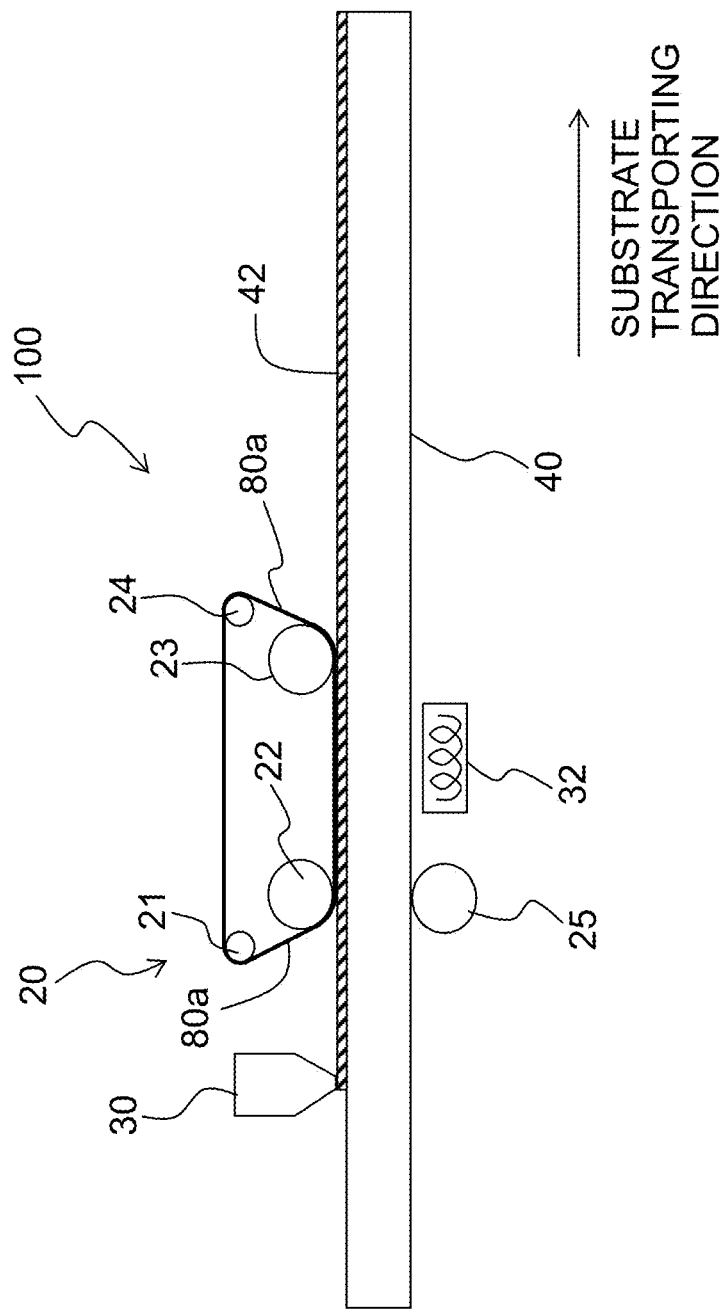
FIG. 6 conceptually depicts another apparatus used for producing the substrate according to the embodiment of the present invention.

In the apparatus 100, a peeling angle may be adjusted by controlling or regulating the installation position of the peeling roll 23 and/or the position of the winding roll 24 which winds or rolls up the mold via the peeling roll 23. The heater 32 may be provided on the side of the coating film 42 relative to the substrate 40, and it is possible to use any other driving means such as a movable table which moves while supporting the substrate, instead of the supporting roll 25. Further, although the peeling roll 23 is used to maintain the state, in which the concave-convex pattern of the mold 80a is pressed against the coating film 42 with the pressing roll 22, during the pre-baking of the coating film 42 by use of the heater 32, it is allowable to use any other supporting member such as a plate-shaped member having a smooth surface and a corner with a curved surface, instead of the peeling roll 23, in order to maintain the above state. The mold 80a is formed as the long mold and the end portions thereof are wound on the feeding roll 21 and the winding roll 24, respectively. The mold 80a, however, may be formed to be an endless belt as depicted in FIG. 6. The mold 80a formed to be the endless belt enables a continuous pressing operation also in a manufacturing line in which many substrates are continuously transported for mass production.

The substrate, in (on) which the pattern made of the sol-gel material layer 42 is formed through the roll process as described above, can be used as, for example, a diffraction-grating substrate for organic EL element, a wire grid polarizer, an antireflection film, or an optical element for providing the light confinement effect in a solar cell by being placed on the photoelectric conversion surface side of the solar cell. Alternatively, the pattern may be transferred to yet another resin by using the above-described substrate having the pattern as a mold (mother die). In this case, the transferred resin pattern is an inverted pattern of the pattern on the substrate. Thus, it is allowable to produce a mold as a replica of the substrate by transferring the transferred inverted pattern to yet another resin. Each of the molds can be subjected to an electroforming process using Ni and the like to form a metal mold. Using each of the molds enables efficient mass production of an optical component such as the diffraction-grating substrate for organic EL element.

<Method for Producing Organic EL Element>

Figure 7:
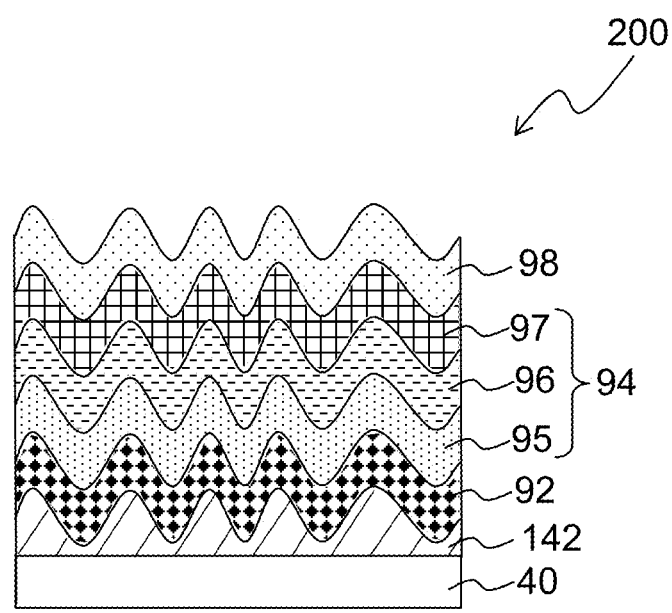
FIG. 7 depicts a cross-section structure of an organic EL element.

An explanation will be made with reference to FIG. 7 about an exemplary production method for producing an organic EL element by use of the substrate on which the concave-convex structure layer made of the sol-gel material is formed through the roll process. At first, a substrate formed with the concave-convex structure layer made of the sol-gel material is cleaned with a brush in order to remove foreign matters and the like adhered to the substrate, and then an organic matter, etc. is removed with an organic solvent and an alkaline cleaning agent using an aqueous solvent. Next, as depicted in FIG. 7, a transparent electrode 92 is stacked on the concave-convex structure layer 142, which is made of the sol-gel material and formed on a substrate 40, so as to maintain the concave-convex structure formed on the surface of the sol-gel material layer 142 made of the sol-gel material. Examples of those usable as the material for the transparent electrode 92 include indium oxide, zinc oxide, tin oxide, indium-tin oxide (ITO) which is a composite material thereof; gold; platinum, silver; copper, etc. Among these materials, ITO is preferable from the viewpoint of the transparency and the electrical conductivity. The thickness of the transparent electrode 92 is preferably within a range of 20 to 500 nm. When the thickness is less than the lower limit, the electrical conductivity is more likely to be insufficient. When the thickness exceeds the upper limit, there is possibility that the transparency is so insufficient that the emitted EL light cannot be extracted to the outside sufficiently. As the method for stacking the transparent electrode 92, it is possible to appropriately use any known method such as the evaporation method, sputtering method, spin coating method, etc. Among these methods, the sputtering method is preferably employed from the viewpoint of improving the adhesion property. Afterwards, the transparent electrode 92 is coated with photoresist, followed by being exposed with an electrode mask pattern. Then, etching is performed with a developing solution, thereby obtaining a transparent electrode having a predetermined pattern. Note that during the sputtering, the substrate is exposed to a high temperature of about 300° C. After cleaning the obtained transparent electrode with a brush and removing any organic matter, etc., with an organic solvent and an alkaline cleaning agent using an aqueous solvent, a UV ozone treatment is preferably performed.

As described above, the aqueous solvent is used for the cleaning performed before formation of the transparent electrode and the cleaning performed after the patterning of the transparent electrode. Since the concave-convex structure layer, of the optical substrate according to the present invention, which is made of the sol-gel material, has a sufficient hydrophobic surface, moisture or water can be eliminated from the optical substrate completely. When the hydrophobicity of the concave-convex structure layer is insufficient, moisture adsorbs to the concave-convex structure layer and eliminating the adsorbed moisture completely becomes difficult even though a treatment for drying the substrate is performed. The organic EL element manufactured by using the optical substrate to which moisture is adsorbed is easy to deteriorate, and is more likely to have dark spots (non-light emitting spots), thereby shortening a service life of the element in some cases. Therefore, the concave-convex structure layer made of the sol-gel material needs to have a sufficient hydrophobic surface.

Next, an organic layer 94 as depicted in FIG. 7 is stacked on the transparent electrode 92. The organic layer 94 is not particularly limited, provided that the organic layer 94 is one usable as an organic layer of the organic EL element. As the organic layer 94, any known organic layer can be used as appropriate. Further, the organic layer 94 may be a stacked body of various organic thin films, and may be, for example, a stacked body of a hole transporting layer 95, a light emitting layer 96, and an electron transporting layer 97 as depicted in FIG. 7. Here, examples of the material of the hole transporting layer 95 include aromatic diamine compounds such as phthalocyanine derivatives, naphthalocyanine derivatives, porphyrin derivatives, N,N'-bis(3-methylphenyl)-(1,1'-biphenyl)-4,4'-diamine (TPD), and 4,4'-bis[N-(naphthyl)-N-phenyl-amino]biphenyl($\alpha$-NPD); oxazole; oxadiazole; triazole; imidazole; imidazolone; stilbene derivatives; pyrazoline derivatives; tetrahydroimidazole; polyarylalkane; butadiene; and 4,4',4"-tris(N-(3-methylphenyl)N-phenylamino) triphenylamine (m-MTDATA). The material of the hole transporting layer 95, however, is not limited to these.

Further, the light emitting layer 96 is provided so that a hole injected from the transparent electrode 92 and an electron injected from a metal electrode 98 are recombined to emit light. Examples of the material usable as the light emitting layer 96 include: metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, and aluminum-quinolinol complex (Alq3); tri-(p-terphenyl-4-yl)amine; 1-aryl-2,5-di(2-thienyl) pyrrole derivatives; pyran; quinacridone; rubren; distyrylbenzene derivatives; distyryl arylene derivatives; distyryl amine derivatives; and various fluorescent pigments or dyes. Furthermore, it is preferable that light-emitting materials selected from the above compounds are mixed as appropriate and then are used. Moreover, it is possible to suitably use a material system generating emission of light from a spin multiplet, such as a phosphorescence emitting material generating emission of phosphorescence, and a compound including, in a part of the molecules, a constituent portion formed by the above materials. Note that the phosphorescence emitting material preferably includes heavy metal such as iridium. A host material having high carrier mobility may be doped with each of the light-emitting materials as a guest material to generate the light emission using the dipole-dipole interaction (Foerster mechanism) or electron exchange interaction (Dexter mechanism). Examples of the material of the electron transporting layer 97 include heterocyclic tetracarboxylic anhydrides such as nitro-substituted fluorene derivatives, diphenylquinone derivatives, thiopyran dioxide derivatives, and naphthaleneperylene; and organometallic complex such as carbodiimide, fluorenylidene methane derivatives, anthraquino dimethane and anthrone derivatives, oxadiazole derivatives, and aluminum-quinolinol complex (Alq3). Further, in the above-described oxadiazole derivatives, it is also possible to use, as an electron transporting material, thiadiazole derivatives in which oxygen atoms of oxadiazole rings are substituted by sulfur atoms and quinoxaline derivatives having quinoxaline rings known as electron attractive group. Furthermore, it is also possible to use a polymeric material in which the above materials are introduced into a macromolecular chain or the above materials are made to be a main chain of the macromolecular chain. Note that the hole transporting layer 95 or the electron transporting layer 97 may also function as the light-emitting layer 96. In this case, the organic layer between the transparent electrode 92 and the metal electrode 98 is double-layered.

From the viewpoint of facilitating the electron injection from the metal electrode 98, a layer made of a metal fluoride or metal oxide such as lithium fluoride (LiF) or $Li_2O_3$, a highly active alkaline earth metal such as Ca, Ba, or Cs, an organic insulating material, or the like may be provided as an electron injection layer between the organic layer 94 and the metal electrode 98. Further, from the viewpoint of facilitating the hole injection from the transparent electrode 92, it is allowable to provide, as a hole injection layer between the organic layer 94 and the transparent electrode 92, a layer made of triazol derivatives, oxadiazole derivative, imidazole derivative, polyarylalkane derivatives, pyrazoline and pyrazolone derivatives, phenylenediamine derivative, arylamine derivatives, amino-substituted calcone derivatives, oxazole derivatives, styrylanthracene derivatives, fluorenone derivatives, hydrazone derivatives, stilbene derivatives, silazane derivatives, aniline-based copolymers, or electroconductive high-molecular oligomar, particularly thiophene oligomer.

Furthermore, when the organic layer 94 is a stacked body formed of the hole transporting layer 95, the light emitting layer 96 and the electron transporting layer 97, the thicknesses of the hole transporting layer 95, the light emitting layer 96 and the electron transporting layer 97 are preferably within a range of 1 to 200 nm, a range of 5 to 100 nm, and a range of 5 to 200 nm, respectively. As the method for stacking the organic layer 94, any known method such as the vapor deposition method, sputtering method, spin coating method and die coating method can be employed as appropriate.

In the step for forming the organic EL element, subsequently, a metal electrode 98 is stacked on the organic layer 94, as depicted in FIG. 7. Materials of the metal electrode 98 are not particularly limited, and a substance having a small work function can be used as appropriate. Examples of the materials include aluminum, MgAg, MgIn, and AlLi. The thickness of the metal electrode 98 is preferably within a range of 50 to 500 nm. When the thickness is less than the lower limit, the electrical conductivity is more likely to be decreased. When the thickness exceeds the upper limit, there is such a possibility that the repair might be difficult to perform when any short circuit occurs between the electrodes. Any known method such as the vapor deposition method, sputtering method, etc. can be adopted to stack the metal electrode 98. Accordingly, an organic EL element 200 having a structure as depicted in FIG. 7 can be obtained.

As described above, the substrate having the concave-convex structure made of the sol-gel material according to the embodiment is advantageous in the following points as compared with a substrate having a concave-convex pattern made of a curable resin. Namely, since the sol-gel material has excellent mechanical strength, any flaw or scratch, adhesion of any foreign matter, generation of any projected portion on the transparent electrode during the production process of the organic EL element are less likely to occur, even when the cleaning with a brush is performed for the surface formed with the concave-convex pattern after the formation of the substrate and the transparent electrode, thereby making it possible to prevent any failure of the element which would be otherwise caused by the flaw, foreign matter, projected portion, etc. Therefore, the organic EL element obtained by the method of the present invention is more superior to that obtained by using the substrate made of the curable resin, in view of the mechanical strength of the substrate having the concave-convex pattern.

The substrate having the concave-convex structure made of the sol-gel material according to the embodiment has excellent chemical resistance, and thus has a relatively high corrosion resistance against the alkaline solution and the organic solvent used in the cleaning step of the substrate and the transparent electrode, thereby making it possible to use a variety of kinds of cleaning solutions. Further, the alkaline developing solution is used during the patterning of the transparent substrate in some cases as described above, and the substrate having the concave-convex structure made of the sol-gel material according to the embodiment has also chemical resistance against such a developing solution. In this respect, the substrate having the concave-convex structure made of the sol-gel material according to the embodiment is advantageous as compared with the substrate formed of the curable resin of which chemical resistance to the alkaline solution is relatively low.

The substrate having the concave-convex structure made of the sol-gel material according to the embodiment has excellent heat resistance. Therefore, the substrate having the concave-convex structure made of the sol-gel material according to the embodiment can withstand a high temperature environment of the sputtering step in the process of forming the transparent electrode for the organic EL element. Further, the substrate, which is produced in accordance with the method of the present invention by use of the sol-gel material, has UV resistance and weather resistance superior to those of the substrate made of the curable resin, and thus also has the resistance against the UV ozone cleaning treatment performed after the formation of transparent electrode.

Regarding the substrate having the concave-convex structure according to this embodiment, the concave-convex structure layer is made of the sol-gel material, and the contact angle of water on the sol-gel material in the flat and smooth film shape is not less than 80°. Thus, moisture hardly adsorbs to the concave-convex structure layer. Using the substrate having the concave-convex structure according to this embodiment for the production of the organic EL element allows moisture to be eliminated easily, even after the aqueous solvent or the like is used for cleaning the substrate of the organic EL element, cleaning after the transparent electrode patterning step, etc. This prevents the deterioration of the organic EL element and the generation of dark spots (non-light emitting spots), thereby making it possible to extend the service life of the element.

When the organic EL element produced by the method of the present invention is used outdoors, any degradation due to the sunlight can be prevented more than when an organic EL element produced by using the substrate having the concave-convex pattern formed in the curable resin is used. Further, any long term use of the organic EL element using the resin substrate is difficult because the curable resin as described above might be degraded to generate any yellowing, any gas, etc. when the curable resin is left under a high temperature environment for a long period of time due to the heat generation associated with the light emission. In contrast, such degradation is prevented in the organic EL element provided with the substrate formed of the sol-gel material.

EXAMPLES

Although the present invention will be described below specifically, the present invention is not limited to the Examples. In the following Examples, a sol-gel material layer was formed on a substrate, and there were performed evaluations of a contact angle of water, the number of dark spots (non-light emitting spots) of an organic EL element, and pattern transferability.

Example 1

0.2 mol of tetraethoxysilane (TEOS) and 0.8 mol of methyltriethoxysilane (MTES) were added dropwise to a mixture solution of 22 mol of ethanol, 5 mol of water, 0.004 mol of concentrated hydrochloric acid, and 4 mol of acetylacetonate, and further 0.5 wt % of surfactant S-386 (produced by AGC SEIMI CHEMICAL CO., LTD.) as an additive was added thereto, followed by being stirred or agitated for 2 hours at a temperature of 23° C. and a humidity of 45% to obtain a sol-gel material solution.

Example 2

A sol-gel material solution was prepared in the same manner as Example 1, except that no TEOS was used and the additive amount of MTES was changed to 1 mol.

Examples 3 to 6

A sol-gel material solution was prepared in the same manner as Example 1, except that dimethyldiethoxysilane (DMDES) was used instead of MTES, and TEOS and DMDES were added in amounts indicated in the table of FIG. 8A.

Example 7

A sol-gel material solution was prepared in the same manner as Example 1, except that phenyltriethoxysilane (PTES) was used instead of MTES, and TEOS and PTES were added in amounts indicated in the table of FIG. 8A.

Example 8

A sol-gel material solution was prepared in the same manner as Example 1, except that no MTES was used, the additive amount of TEOS was changed to 1 mol, and 0.005 mol of perfluorodecyltriethoxysilane (FTES) was added dropwise.

Example 9

A sol-gel material solution was prepared in the same manner as Example 1, except that TEOS and MTES were added in amounts indicated in the table of FIG. 8A, and 0.005 mol of FTES was added dropwise.

Example 10

A sol-gel material solution was prepared in the same manner as Example 5, except that 0.001 mol of FTES was further added dropwise to the sol-gel material solution.

Comparative Example 1

A sol-gel material solution was prepared in the same manner as Example 1, except that no MTES was used and the additive amount of TEOS was changed to 1 mol. The sol-gel material solution of Comparative Example 1 had the same composition as the sol-gel material solution of Example 8, except that the sol-gel material solution of Comparative Example 1 did not contain FTES.

Comparative Examples 2 to 4

In order to compare the results of Comparative Examples 2 to 4 with the results of Examples 1 and 2, a sol-gel material solution was prepared in the same manner as Example 1, except that the mixture amounts of TEOS and MTES were changed to values indicated in the table of FIG. 8A. The sol-gel material solution of Comparative Example 3 had the same composition as the sol-gel material solution of Example 9, except that the sol-gel material solution of Comparative Example 3 did not contain FTES.

Comparative Examples 5 to 8

In order to compare the results of Comparative Examples 5 to 8 with the results of Examples 3 to 6, a sol-gel material solution was prepared in the same manner as Example 3, except that the mixture amounts of TEOS and DMDES were changed to values indicated in the table of FIG. 8A.

Comparative Example 9

In order to compare the result of Comparative Example 9 with the results of Example 9 and Comparative Example 3, a sol-gel material solution was prepared in the same manner as Example 9, except that the additive amount of FTES was changed to 0.01 mol.

Comparative Example 10

In order to compare the result of Comparative Example 10 with the results of Examples 5 and 10, a sol-gel material solution was prepared in the same manner as Example 5, except that 0.01 mol of FTES was further added dropwise to the sol-gel material solution.

Regarding the sol-gel material solutions of Examples 1 to 10 and Comparative Examples 1 to 10, the contact angle of water on the sol-gel material in the flat and smooth film shape, the number of dark spots (non-light emitting spots) of the organic EL element, and the concave-convex pattern transferability were evaluated as explained below. The evaluations were made on the basis of the criteria described below. The table of FIG. 8B shows the evaluation results.

<Measurement of Contact Angle of Water on Sol-Gel Material in Flat and Smooth Film Shape>

Figure 9A:
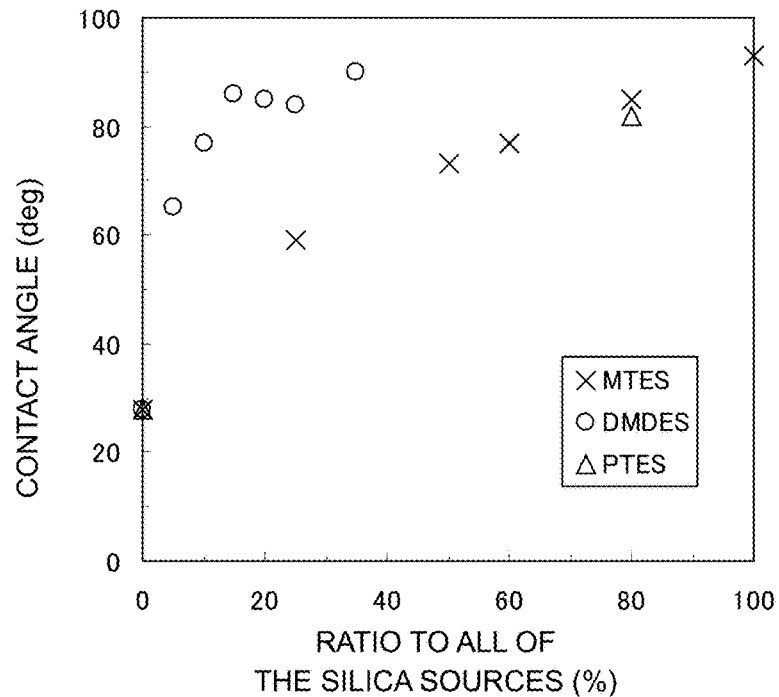
FIGS. 9A and 9B are graphs based on evaluation results of samples prepared in Examples 1 to 7 and Comparative Examples 1 to 6.

Each of the sol-gel material solutions of Examples 1 to 10 and Comparative Examples 1 to 10 was applied onto a glass plate (OA10G produced by Nippon Electric Glass Co., Ltd.), which was made of soda lime and had been cut to have a size of 5×5×0.07 cm by means of the spin coating, thereby forming a coating film having a film thickness of 0.5 µm. The spin coating was performed by a spin coater ACT-300DII (produced by ACTIVE CO., Ltd.) for 8 seconds with rotation speed of 500 rpm, and then for 3 seconds with rotation speed of 1000 rpm. After the spin coating, the coating film was dried for 90 seconds at room temperature, and then subjected to pre-baking for 5 minutes at a temperature of 100° C. by use of a hot plate. The obtained substrate was heated for 1 hour at a temperature of 300° C., thereby baking the sol-gel material layer. In this manner, the flat and smooth film formed of the sol-gel material was obtained by using each of the sol-gel material solutions of Examples 1 to 10 and Comparative Examples 1 to 10. Then, the contact angle of water on each of the flat and smooth films was measured by means of a contact angle meter (CA-A produced by Kyowa Interface Science Co., LTD.). The table of FIG. 8B shows measurement results, and FIG. 9A is a graph in which the contact angle of water is plotted against the ratio of MTES, DMDES, or PTES to all of the silica sources on the basis of each of the measurement results of Examples 1 to 7 and Comparative Examples 1 to 6. Regarding all of the samples prepared by using the solutions of Examples 1 to 10, the contact angles of water were not less than 82°. Regarding all of the samples prepared by using the solutions of Comparative Examples 1 to 6, the contact angles of water were not more than 77°. Regarding Comparative Examples 7 to 10, although the solutions were applied by the spin coating, no coating film was formed.

<The Number of Dark Spots of Organic EL Element>

An organic EL element was manufactured in accordance with the following method to evaluate the number of dark sports of the organic EL element manufactured by using the substrate having the coating film made of the sol-gel material. Each of the sol-gel material solutions of Examples 1 to 10 and Comparative Examples 1 to 10 was applied onto a cut glass plate (OA10G produced by Nippon Electric Glass Co., Ltd.) made of soda lime and having a size of 5×5×0.07 cm by means of the spin coating, thereby forming a coating film having a film thickness of 0.5 µm. The spin coating was performed by a spin coater ACT-300DII (produced by ACTIVE CO., Ltd.) for 8 seconds with rotation speed of 500 rpm, and then for 3 seconds with rotation speed of 1000 rpm. After the spin coating, the coating film was dried for 90 seconds at room temperature, and then subjected to pre-baking for 5 minutes at a temperature of 100° C. by use of a hot plate. The obtained substrate was heated for 1 hour at a temperature of 300° C., thereby baking the sol-gel material layer. In order to remove foreign matters and the like adhered to the substrate having the flat and smooth film formed of the sol-gel material obtained described above, the substrate was subjected to ultrasonic cleaning using an alkali cleaning agent and water, and then dried at normal temperature (room temperature). An ITO film having a thickness of 120 nm was formed on the cleaned substrate by the sputtering method at normal temperature. The obtained transparent electrode was cleaned with an alkali cleaning agent and water, and then dried at normal temperature. On the transparent electrode processed as described above, a hole transporting layer (4,4',4" tris(9-carbazole)triphenylamine, thickness: 35 nm), a light emitting layer (tris(2-phenylpyridinato)iridium(III) complex-doped 4,4',4"tris(9-carbazole)triphenylamine, thickness: 15 nm; tris(2-phenylpyridinato)iridium(III) complex-doped 1,3,5-tris(N-phenylbenzimidazole-2-yl)benzene, thickness: 15 nm), an electron transporting layer (1,3,5-tris(N-phenylbenzimidazole-2-yl)benzene, thickness: 65 nm), and a lithium fluoride layer (thickness: 1.5 nm) were each stacked by a vapor deposition method, and further a metal electrode (aluminum, thickness: 50 nm) was formed thereon by the vapor deposition method. Accordingly, the organic EL element was obtained.

Figure 9B:
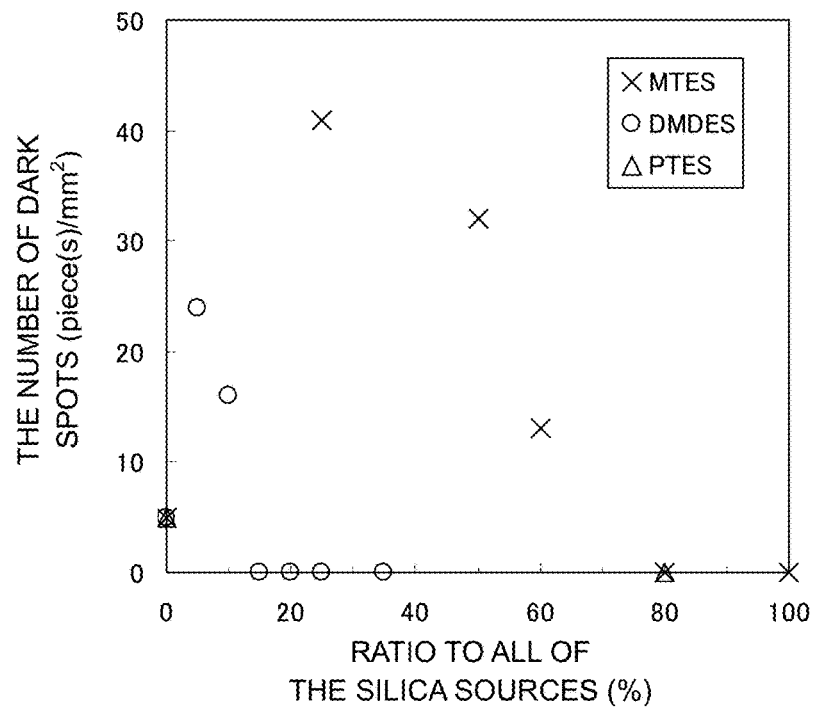
Figure 10:
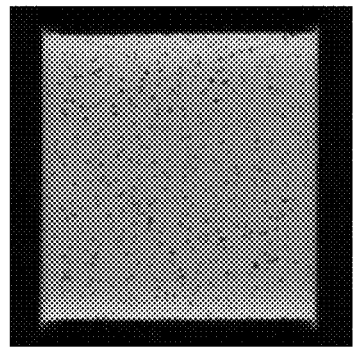
FIG. 10 is an exemplary photographic image of light emission of the organic EL element which is used for evaluation of the number of dark spots of the organic EL element in Examples and Comparative Examples.

A voltage of 4V was applied to the organic EL element manufactured by using each of the sol-gel material solutions of Examples 1 to 10 and Comparative Examples 1 to 10, and a photographic image of light emission as shown in FIG. 10 was obtained. The points which appear dark in the photographic image of light emission as shown in FIG. 10 are the dark spots (non-light emitting spots). The number of dark spots per one square millimeter of the organic EL element was measured by using such a photographic image of light emission. Since the organic EL element, which was manufactured under the same conditions except that a glass substrate having no sol-gel material layer was used, had the number of dark spots of less than 1 piece/mm$^2$, the organic element having the number of dark spots of less than 1 piece/mm$^2$ was evaluated to be satisfactory or acceptable. The table of FIG. 8B shows the results, and FIG. 9B is a graph in which the number of dark spots of the organic EL element is plotted against the ratio of MTES, DMDES, or PTES to all of the silica sources on the basis of each of the measurement results of Examples 1 to 7 and Comparative Examples 1 to 6. The organic EL elements manufactured by using the solutions of Examples 1 to 10 each had the number of dark spots of less than 1 piece/mm$^2$, and thus all of them were evaluated to be satisfactory. The organic EL elements manufactured by using the solutions of Comparative Examples 1 to 6 each had the number of dark spots of 5 pieces/mm$^2$, and thus all of them were evaluated to be unsatisfactory or defective. Regarding Comparative Examples 7 to 10, although the solutions were applied by the spin coating, no coating film was formed.

<Evaluation of Concave-Convex Pattern Transferability>

The pattern transferability of the sol-gel material was evaluated as follows. Namely, each of the sol-gel material solutions of Examples 1 to 10 and Comparative Examples 1 to 10 was applied onto a glass plate made of soda-lime by means of a spin coater, and the coating film after the spin coating was dried for 20 to 1,200 seconds at room temperature. Then, the surface, of the mold, on which a line-and-space pattern has been formed was pressed against the coating film on the glass substrate while the pressing roll at 23° C. was being rotated from one end to the other end of the glass substrate. Immediately after the completion of the pressing, the substrate was moved on a hot plate and then heated at a temperature of 100° C. (pre-baking). After the heating was continued for 30 seconds or 5 minutes, the substrate was removed from the hot plate and the mold was manually released from the edge of the substrate. The mold was peeled off or released such that the angle (peel angle) of the mold with respect to the substrate was about 30°. After peeling off the mold from the substrate, the concave-convex pattern on the coating film was measured by using SPM, and the depth of the concave-convex pattern was read at four points to calculate its average value. When the shape of the concave-convex pattern was rectangular and the average value of the depth of the concave-convex pattern was not less than 95% (176 nm) of the depth of pattern of the mold (185 nm), it was evaluated to be satisfactory. When the shape of the concave-convex pattern was round or the average value of the depth of the concave-convex pattern was less than 95% (176 nm) of 185 nm, it was evaluated to be unsatisfactory. Further, in terms of the relation with pre-baking time, the acceptance/rejection (satisfaction/unsatisfaction) criterion was subdivided as follows. "++" means that the sample was evaluated as satisfactory both in the pre-baking for 30 seconds and the pre-baking for 5 minutes, "+" means that the sample was evaluated as unsatisfactory in the pre-baking for 30 seconds but evaluated as satisfactory in the pre-baking for 5 minutes, and "−" means that the sample was evaluated as unsatisfactory both in the pre-baking for 30 seconds and the pre-baking for 5 minutes. The table of FIG. 8B shows the results. Regarding the samples of Examples 1, 2, and 7, all of them were evaluated as unsatisfactory in the pre-baking for 30 seconds but evaluated as satisfactory in the pre-baking for 5 minutes, irrespective of the drying time. Thus, the range of drying time (hereinafter referred to as "imprint margin" as appropriate) which allows the transferred concave-convex pattern to be evaluated as satisfactory was 20 to 1,200 seconds. Regarding the samples of Examples 3 to 6, 9, and 10 and Comparative Examples 3 and 4, all of them were evaluated as satisfactory both in the pre-baking for 30 seconds and the pre-baking for 5 minutes irrespective of the drying time. Thus the imprint margin was 20 to 1,200 seconds. Regarding the samples of Example 8, the sample which was dried for 20 seconds was evaluated as satisfactory both in the pre-baking for 30 seconds and the pre-baking for 5 minutes, but the samples which were dried for 90 to 1,200 seconds were evaluated as unsatisfactory both in the pre-baking for 30 seconds and the pre-baking for 5 minutes. Thus, the imprint margin of Example 8 was 20 seconds. Regarding the samples of Comparative Example 1, the sample which was dried for 20 seconds was evaluated as satisfactory both in the pre-baking for 30 seconds and the pre-baking for 5 minutes, but the samples which were dried for 90 to 1,200 seconds were evaluated as unsatisfactory both in the pre-baking for 30 seconds and the pre-baking for 5 minutes. Thus, the imprint margin of Comparative Example 1 was 20 seconds. Regarding the samples of Comparative Examples 2, 5 and 6, the samples which were dried for 20 seconds and 90 seconds were evaluated as satisfactory both in the pre-baking for 30 seconds and the pre-baking for 5 minutes, but the samples which were dried for 300 seconds and 1,200 seconds were evaluated as unsatisfactory both in the pre-baking for 30 seconds and the pre-baking for 5 minutes. Thus, the imprint margin of each of Comparative Examples 2, 5 and 6 was 20 to 90 seconds. Regarding Comparative Examples 7 to 10, although the solutions were applied by the spin coating, no coating film was formed.

Figure 11A:
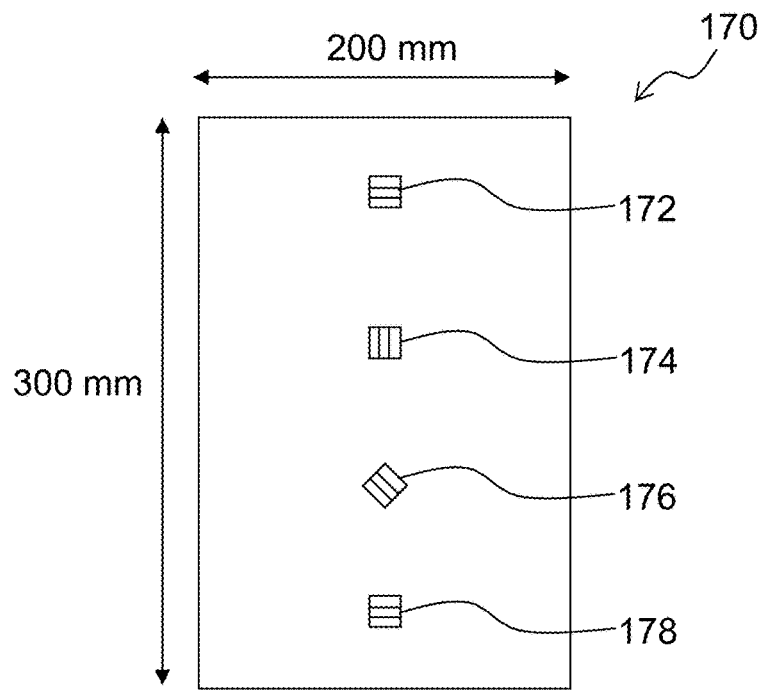
FIGS. 11A to 11C each depict a schematic structure of a mold used in Examples and Comparative Examples.
Figure 11B:
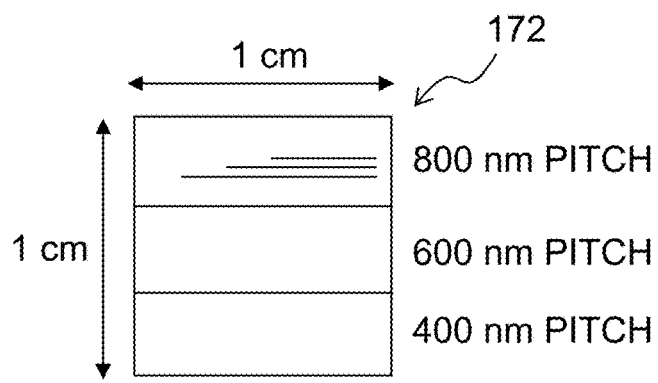
Figure 11C:
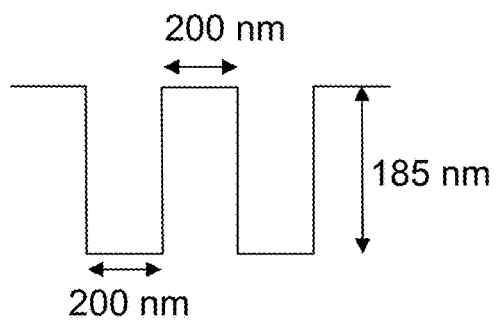

The mold having the line-and-space pattern was manufactured as follows. The line-and-space pattern was formed as a master on a silicon substrate by electron beam lithography. The pattern of the master was transferred on a fluorine-containing photo-curable resin layer applied on a PET film, thereby preparing the mold. As depicted in FIG. 11A, the mold was a sheet 170 having a size of 300 mm×200 mm×0.1 mm (thickness), and four line-and-space patterns (each having 1 cm×1 cm) 172, 174, 176, 178, which had concave-convex grooves extending in mutually different directions, were formed in a surface of the sheet 170 with a predetermined spacing distance intervening therebetween. As depicted in FIG. 11B, each of the patterns was formed to be partitioned into three, and three portions of the partitioned pattern had pitches of 400 nm, 600 nm, and 800 nm, respectively. The concavities and convexities in each of the three portions of the partitioned pattern had a depth of 185 nm. FIG. 11C is a cross-sectional view of the partitioned pattern having a pitch of 400 nm. As the pressing roll, it was used a roll which had an outer periphery covered with EPDM having a thickness of 3 mm, had a roll diameter ($\varphi$) of 70 mm, and had a length of 500 mm in the axial direction of the shaft.

As can be seen from the evaluation results of Examples 1 to 10 and Comparative Examples 1 to 10 shown in the tables of FIGS. 8A and 8B and FIGS. 9A and 9B, the sol-gel material needs to have the hydrophobicity which allows the contact angle of water on the sol-gel material in a flat and smooth film shape is not less than 80°, in order to make the number of dark spots of the organic EL element manufactured by using the sol-gel material less than 1 piece/mm$^2$. Especially, when the contact angle was not less than 85° or exceeded 86°, more preferable results were obtained.

According to the evaluation results of Examples 1 and 2 and Comparative Examples 1 to 4, when the mixture of TEOS and MTES is used as the sol-gel material, it is preferred that the ratio of MTES (molar ratio) be not less than 80%. When the ratio of MTES is less than 80%, the contact angle of water is less than 80°. In this case, the hydrophobicity of the sol-gel material layer is insufficient, and thus the organic EL element manufactured by using this substrate has residual moisture, thereby increasing the number of dark spots.

According to the evaluation results of Examples 3 to 6 and Comparative Examples 5 to 8, when the mixture of TEOS and DMDES is used as the sol-gel material, it is preferred that the ratio of DMDES (molar ratio) be in a range of 15 to 35%. When the ratio of DMDES is less than 15%, the contact angle of water is less than 80°. In this case, the hydrophobicity of the sol-gel material layer is insufficient, and thus the organic EL element manufactured by using this substrate has residual moisture, thereby increasing the number of dark spots. When the ratio of DMDES exceeds 35%, the DMDES separates in the solution, which makes it difficult to form the coating film on the substrate.

According to the evaluation results of Example 8 and Comparative Example 1, when only TEOS is used as the sol-gel material, the contact angle of water is less than 80°. In this case, the hydrophobicity of the sol-gel material layer is insufficient, and thus the organic EL element manufactured by using this substrate has residual moisture, thereby causing the number of dark spots to exceed 1 piece/mm$^2$. However, when 0.5 mol % of FTES is added to TEOS, the contact angle of water becomes not less than 80°. In this case, the hydrophobicity of the sol-gel material layer is sufficient, and thus the organic EL element manufactured by using this substrate has no residual moisture, thereby allowing the number of dark spots to be less than 1 piece/mm$^2$.

According to the evaluation results of Example 9 and Comparative Examples 3 and 9, when a mixture of TEOS and MTES, of which mixture ratio is 1:1 in a molar ratio, is used as the sol-gel material, the contact angle of water is less than 80°. In this case, the hydrophobicity of the sol-gel material layer is insufficient, and thus the organic EL element manufactured by using this substrate has residual moisture, thereby causing the number of dark spots to exceed 1 piece/mm$^2$. However, when FTES is added to the mixture of TEOS and MTES at the ratio of less than 1 mol % to the total amount of TEOS and MTES, the contact angle of water becomes not less than 80°. In this case, the hydrophobicity of the sol-gel material layer is sufficient, and thus the organic EL element manufactured by using this substrate has no residual moisture, thereby allowing the number of dark spots to be less than 1 piece/mm$^2$. When FTES is added to the mixture of TEOS and MTES at the ratio of not less than 1 mol % to the total amount of TEOS and MTES, the FTES separates in the solution, which makes it difficult to form the coating film on the substrate.

According to the evaluation results of Examples 5 and 10 and Comparative Example 10, when a mixture of TEOS and DMDES, of which mixture ratio is 3:1 in a molar ratio, is used as the sol-gel material, the contact angle of water is not less than 80°. In this case, the hydrophobicity of the sol-gel material layer is sufficient, and thus the organic EL element manufactured by using this substrate has no residual moisture, thereby allowing the number of dark spots to be less than 1 piece/mm$^2$. When FTES is added to the mixture of TEOS and DMDES at the ratio of less than 1 mol % to the total amount of TEOS and DMDES, the contact angle is even greater. However, when FTES is added to the mixture of TEOS and DMDES at the ratio of not less than 1 mol % to the total amount of TEOS and DMDES, the FTES separates in the solution, which makes it difficult to form the coating film on the substrate.

According to the evaluation results of Examples 1 to 7, when the mixture of TEOS and MTES or the mixture of TEOS and PTES is used as the sol-gel material, the pre-baking is required to be performed for 5 minutes in order to perform a good pattern transfer. On the other hand, when the mixture of TEOS and DMDES is used as the sol-gel material, the pre-baking is required to be performed for only 30 seconds in order to perform a good pattern transfer. Thus, using the mixture of TEOS and DMDES as the sol-gel material is preferred, because it makes it possible to reduce the time for pattern transfer and improve productivity.

Although the present invention has been explained as above with the embodiment, Examples, and Comparative Examples, the substrate having the concave-convex structure made of the hydrophobic sol-gel material, the solution used for producing the substrate, and the method for producing the substrate, of the present invention, are not limited to the above-described embodiment etc., and may be appropriately modified or changed within the range of the technical ideas described in the following claims. The substrate having the concave-convex structure in accordance with the present invention is not limited to the production of the optical substrate, and can be used for various uses including, for example, the production of optical elements such as microlens arrays, nanoprism arrays, and optical waveguides; the production of optical components such as lenses; the production of LED; the production of solar cells; the production of antireflection films; the production of semiconductor chips; the production of patterned media; the production of data storage; the production of electronic paper; the production of LSI; paper manufacturing; food manufacturing; and the biology field such as immunoassay chips and cell culture sheets.

The substrate having the concave-convex structure according to the present invention includes the concave-convex structure layer made of the sol-gel material. Thus, the substrate having the concave-convex structure according to the present invention is excellent in heat resistance and corrosion resistance and is also resistant to the process for manufacturing an element (device) in which the substrate having the concave-convex structure is incorporated. Further, the substrate having the concave-convex structure according to the present invention has a hydrophobic surface. Thus, the element in which the substrate according to the present invention is incorporated can have the inside of low humidity. This reduces any defect such as the dark spot, thereby making it possible to produce the element having a long service life. Therefore, the substrate having the concave-convex structure according to the present invention is quite effective for various devices such as the organic EL elements and the solar cells. Further, the method for producing the substrate having the concave-convex structure according to the present invention uses the roll process, and thus it can produce the member having the concave-convex structure with high throughput. The various devices, such as the organic EL elements and the solar cells, which are excellent in the heat resistance and corrosion resistance can be produced by using, as the optical substrate, the substrate having concave-convex structure obtained in this manner. Further, the use of the substrate according to the present invention is not limited to the optical substrate. The substrate according to the present invention can be used in various uses. For example, the substrate according to the present invention can be used, for example, for the production of light condensing or focusing films and antireflection films for solar cells and various displays; the production of semiconductor chips and the like; paper manufacturing such as the production of tissues (for example, drums used for compressing webs); food manufacturing such as noodle making; and the production in the biologic field such as bio chips including fine or minute channels, bio chips for analyzing genome and proteomoe, cell culture sheets (nanopillar sheets used as cell culture containers), and microchips for cell fractionation or cell separation.

What is claimed is:

1. A concave-convex structure substrate, comprising:
  a substrate; and
  a concave-convex structure layer made of silica obtained by baking a solution comprising a sol-gel material and formed on the substrate,
  wherein the sol-gel material comprises:
    a composition comprising tetraalkoxysilane and dialkoxysilane, the dialkoxysilane having an amount of 15 to 35 mol %, or
    a composition comprising at least one selected from the group consisting of tetraalkoxysilane, trialkoxysilane, and dialkoxysilane, and further comprising a fluorine-containing alkoxysilane, the fluorine-containing alkoxysilane having an amount of 0.1 mol % or more and less than 1 mol %, and
  wherein a contact angle of water on a flat and smooth film made of the silica obtained by baking the solution containing the sol-gel material is not less than 80°.

2. The concave-convex structure substrate according to claim 1, wherein:
  the dialkoxysilane is dimethyldiethoxysilane,
  the tetraalkoxysilane is tetraethoxysilane, and
  the trialkoxysilane is methyltriethoxysilane or phenyltriethoxysilane.

3. The concave-convex structure substrate according to claim 1, wherein the concave-convex structure substrate is an optical substrate.

4. A method for producing an organic light emitting diode, comprising:
  successively stacking a transparent electrode, an organic layer, and a metal electrode on the concave-convex surface of a diffraction grating substrate having a concave-convex surface,
  wherein the concave-convex structure substrate as defined in claim 1 is used as the diffraction grating substrate.

5. A method for producing the concave-convex structure substrate, comprising:
  coating a substrate with a solution containing a sol-gel material to form a coating film;
  drying the coating film;
  pressing a roll-shaped mold having a concave-convex pattern against the dried coating film so as to press the concave-convex pattern against the coating film;
  releasing the mold from the coating film; and
  baking the coating film to which the concave-convex pattern has been transferred to obtain a concave-convex structure layer made of silica,
  wherein the sol-gel material comprises:
    a composition comprising tetraalkoxysilane and dialkoxysilane, the dialkoxysilane having an amount of 15 to 35 mol %, or
    a composition comprising at least one selected from the group consisting of tetraalkoxysilane, trialkoxysilane, and dialkoxysilane, and further comprising a fluorine-containing alkoxysilane, the fluorine-containing alkoxysilane having an amount of 0.1 mol % or more and less than 1 mol % in the composition, and
  wherein a contact angle of water on a flat and smooth film made of the silica obtained by baking the coating film is not less than 80°.

* * * * *